(12) United States Patent
Fukuchi

(10) Patent No.: US 10,448,507 B2
(45) Date of Patent: Oct. 15, 2019

(54) COPPER FOIL, COPPER-CLAD LAMINATE BOARD, METHOD FOR PRODUCING PRINTED WIRING BOARD, METHOD FOR PRODUCING ELECTRONIC APPARATUS, METHOD FOR PRODUCING TRANSMISSION CHANNEL, AND METHOD FOR PRODUCING ANTENNA

(71) Applicant: JX NIPPON MINING & METALS CORPORATION, Tokyo (JP)

(72) Inventor: Ryo Fukuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 168 days.

(21) Appl. No.: 15/405,517

(22) Filed: Jan. 13, 2017

(65) Prior Publication Data

US 2017/0208686 A1    Jul. 20, 2017

(30) Foreign Application Priority Data

Jan. 15, 2016    (JP) .................................. 2016-005645

(51) Int. Cl.
*C25D 3/38*    (2006.01)
*H05K 1/09*    (2006.01)
(Continued)

(52) U.S. Cl.
CPC ................. *H05K 1/09* (2013.01); *C22F 1/08* (2013.01); *C25D 7/0614* (2013.01); *C25D 3/12* (2013.01);
(Continued)

(58) Field of Classification Search
None
See application file for complete search history.

(56) References Cited

U.S. PATENT DOCUMENTS 5,834,140 A * 11/1998 Wolski ..................... C25D 1/04
429/220
6,989,199 B2 * 1/2006 Yamamoto ............. H05K 3/025
428/607
(Continued)

FOREIGN PATENT DOCUMENTS

JP    2002307611 A    10/2002
JP    2004244656       9/2004
(Continued)

OTHER PUBLICATIONS

Hatano et al. "Effect of Material Processing on Fatigue of FPC Rolled Copper Foil" Journal of Electronic Materials, 2000, 29(5), 611-616. (Year: 2000).*
(Continued)

*Primary Examiner* — Robert S Loewe
(74) *Attorney, Agent, or Firm* — Drinker Biddle & Reath LLP

(57) ABSTRACT

To provide a copper foil and a copper-clad laminate board that have a favorably suppressed transmission loss even in the use thereof in a high frequency circuit board that is folded in use or bent in use. A copper foil having a number of times of folding of 1 or more in a folding test under a prescribed condition for a copper-clad laminate board containing the copper foil having adhered thereto an insulating substrate.

23 Claims, 2 Drawing Sheets

(51) Int. Cl.
*C22F 1/08* (2006.01)
*C25D 7/06* (2006.01)
*H05K 1/03* (2006.01)
*C25D 3/12* (2006.01)
*C25D 3/56* (2006.01)
*C25D 5/48* (2006.01)
*C25D 9/08* (2006.01)

(52) U.S. Cl.
CPC ............... *C25D 3/38* (2013.01); *C25D 3/562* (2013.01); *C25D 5/48* (2013.01); *C25D 9/08* (2013.01); *H05K 1/0393* (2013.01); *H05K 2201/0141* (2013.01); *H05K 2201/0154* (2013.01); *H05K 2201/0355* (2013.01)

(56) References Cited

U.S. PATENT DOCUMENTS

| | | | |
|---|---|---|---|
| 7,074,882 B2 * | 7/2006 | Hikita | C08G 73/1046 257/E23.007 |
| 7,651,783 B2 * | 1/2010 | Tsuchida | C23C 28/00 428/447 |
| 7,691,487 B2 * | 4/2010 | Nagatani | C25D 1/04 428/607 |
| 2004/0154930 A1 | 8/2004 | Shinozaki | |
| 2006/0088723 A1 * | 4/2006 | Suzuki | C25D 5/16 428/612 |
| 2008/0006441 A1 * | 1/2008 | Yamagata | H05K 1/032 174/260 |
| 2008/0174016 A1 * | 7/2008 | Sato | H05K 1/0346 257/741 |
| 2011/0005812 A1 * | 1/2011 | Shimokawa | H05K 3/384 174/255 |
| 2011/0189499 A1 * | 8/2011 | Fujisawa | B32B 15/01 428/607 |
| 2011/0189501 A1 * | 8/2011 | Fujisawa | B32B 15/08 428/623 |
| 2013/0040162 A1 * | 2/2013 | Fujisawa | B32B 15/01 428/607 |
| 2017/0178761 A1 * | 6/2017 | Ito | C25D 7/00 |
| 2017/0332489 A1 * | 11/2017 | Kimura | C22C 9/00 |

FOREIGN PATENT DOCUMENTS

| | | |
|---|---|---|
| JP | 4161304 B2 | 10/2008 |
| JP | 4704025 B2 | 6/2011 |
| JP | 2014224313 | 12/2014 |
| KR | 20150040235 | 4/2015 |
| KR | 20150064140 A | 6/2015 |
| TW | 201325332 A | 6/2013 |
| TW | 201438900 A | 10/2014 |
| TW | 201524280 A | 6/2015 |

OTHER PUBLICATIONS

Merchant et al. "Mechanical Fatigue of Thin Copper Foil" Journal of Electronic Materials 1999, 28(9), 998-1007. (Year: 1999).*

* cited by examiner

CROSS SECTION IN WIDTH
DIRECTION OF SPECIMEN

COPPER FOIL, COPPER-CLAD LAMINATE BOARD, METHOD FOR PRODUCING PRINTED WIRING BOARD, METHOD FOR PRODUCING ELECTRONIC APPARATUS, METHOD FOR PRODUCING TRANSMISSION CHANNEL, AND METHOD FOR PRODUCING ANTENNA

BACKGROUND OF THE INVENTION

Field of the Invention

The present invention relates to a copper foil, a copper-clad laminate board, a method for producing a printed wiring board, a method for producing an electronic apparatus, a method for producing a transmission channel, and a method for producing an antenna.

Related Art

Printed wiring boards have been largely developed over the recent half century, and now result in use in almost all electronic apparatuses. Following the recent increase of the demand of miniaturization and performance enhancement of electronic apparatuses, the enhancement of the mounting density of components and the increase of the signal frequency proceed, and the printed wiring boards are demanded to have an excellent capability under high frequency signals.

A high frequency substrate is demanded to have a reduced transmission loss for ensuring the quality of the output signal. The transmission loss is constituted mainly by a dielectric loss caused by a resin (i.e., a substrate) and a conductor loss caused by a conductor (i.e., a copper foil). The dielectric loss is decreased when the dielectric constant and the dielectric dissipation factor of the resin are decreased. The conductor loss in a high frequency signal is caused mainly in such a mechanism that the skin effect, in which an electric current having a higher frequency flows only a surface of a conductor, decreases the cross sectional area, through which an electric current flows, and thereby the resistance is increased. Accordingly, a high frequency circuit is necessarily formed with higher accuracy than the ordinary circuits, and excellent circuit formability is demanded.

As a technique for decreasing the transmission loss of the high frequency copper foil, for example, Patent Literature 1 describes a metal foil for a high frequency circuit containing a metal foil having coated on one surface or both surfaces thereof silver or a silver alloy, and having on the silver or silver alloy layer a coated layer formed in a thickness smaller than the silver or silver alloy layer. The literature describes that the metal foil can be provided that is reduced in loss due to the skin effect even in an ultrahigh frequency region used in satellite communications.

Patent Literature 2 describes a roughened rolled copper foil for a high frequency circuit, in which the integrated intensity (I(200)) of the (200) plane of the rolled surface of the rolled copper foil after recrystallization annealing obtained by X-ray diffraction is $I(200)/I_0(200)>40$ with respect to the integrated intensity $I_0(200)$ of the (200) plane of fine powder copper obtained by X-ray diffraction, the arithmetic average roughness Ra of the roughened surface after performing a roughening treatment on the rolled surface by electrolytic plating is from 0.02 μm to 0.2 μm, the ten-point average roughness Rz is from 0.1 μm to 1.5 μm, and the copper foil is a material for a printed circuit board. The literature describes that a printed circuit board can be provided that is capable of being used under a high frequency exceeding 1 GHz.

Patent Literature 3 describes an electrolytic copper foil having on a part of the surface of the copper foil an uneven surface having a surface roughness of from 2 to 4 μm formed of bumpy protrusions. The literature describes that an electrolytic copper foil can be provided that is excellent in high frequency wave transmission characteristics.

Patent Literature 1: Japanese Patent No. 4,161,304

Patent Literature 2: Japanese Patent No. 4,704,025

Patent Literature 3: JP-A-2004-244656

As described in the foregoing, the conductor loss with a high frequency signal is mainly caused in such a mechanism that the cross sectional area of the conductor, through which an electric current flows, is decreased due to the skin effect, in which an electric current having a higher frequency flows only a surface of a conductor, and thereby the resistance is increased. A high frequency board that is capable of being folded in use for enhancing the degree of freedom in design is liable to cause cracks in the circuit, and the transmission loss is increased due to the influence of the cracks. The present inventors have found that the transmission loss of the high frequency circuit board can be favorably suppressed by suppressing cracks from being formed in a copper foil that is folded in use or bent in use.

SUMMARY OF THE INVENTION

The invention has been made under the circumstances, and an object thereof is to provide a copper foil and a copper-clad laminate board that have a favorably suppressed transmission loss even in the use thereof in a high frequency circuit board that is folded in use or bent in use.

The invention has been achieved based on the aforementioned knowledge, and relates to, as one aspect, a copper foil having a number of times of folding of 1 or more in a folding test under a prescribed condition for a copper-clad laminate board containing the copper foil having adhered thereto an insulating substrate.

The invention relates to, as another aspect, a copper foil having a number of cracks having a depth of 1 μm or more from a surface of the copper foil being 3 or less after a sliding bending test in a prescribed number of times under a prescribed condition for a copper-clad laminate board containing the copper foil having adhered thereto an insulating substrate (the copper foil having an insulating substrate adhered to the copper foil), in an observation of a region having a size of a thickness of the copper foil×100 μm on a cross section of the copper foil in parallel to a sliding direction in the sliding bending test.

The invention relates to, as still another aspect, a copper foil having a number of cracks having a depth of 2 μm or more from a surface of the copper foil being 2 or less after a sliding bending test in a prescribed number of times under a prescribed condition for a copper-clad laminate board containing the copper foil having adhered thereto an insulating substrate, in an observation of a region having a size of a thickness of the copper foil×100 μm on a cross section of the copper foil in parallel to a sliding direction in the sliding bending test.

In one embodiment of the copper foil according to the invention, the insulating substrate is any one of the following insulating substrates (A) to (C)

(A) a fluorine resin,
(B) a polyimide resin having a dielectric dissipation factor of 0.01 or less, and
(C) a liquid crystal polymer resin,
and
a condition for adhering the copper foil and the insulating substrate is any one of the following conditions (D) to (F):
(D) for a case where the insulating substrate is the fluorine resin, a pressure of 5 MPa, a heating temperature and a heating time of 350° C. for 30 minutes,
(E) for a case where the insulating substrate is the polyimide resin having a dielectric dissipation factor of 0.01 or less, a pressure of 4 MPa, a heating temperature and a heating time of any one of the following (E-1) to (E-4):
(E-1) 370° C. for 0.8 second,
(E-2) 370° C. for 2 seconds,
(E-3) 350° C. for 4 seconds, and
(E-4) 300° C. for 10 minutes, and
(F) for a case where the insulating substrate is the liquid crystal polymer resin, a pressure of 3.5 MPa, a heating temperature and a heating time of 300° C. for 10 minutes.

In another embodiment of the copper foil according to the invention, the insulating substrate is a polytetrafluoroethylene resin, a polyimide resin having a dielectric dissipation factor of 0.006 or less, or a liquid crystal polymer resin containing a copolymer of a hydroxybenzoate ester and a hydroxynaphthoate ester.

In still another embodiment of the copper foil according to the invention, the copper foil comprises a surface-treated surface on one surface or both surfaces thereof (of the copper foil), and the surface-treated surface has an arithmetic average surface roughness Ra of from 0.05 to 0.40 µm, a ten-point average surface roughness Rz of from 0.25 to 2.0 µm, and a surface area ratio A/B of from 1.5 to 3.0, wherein A represents a three-dimensional surface area measured with a laser microscope, and B represents a two-dimensional surface area in a planar view of a view field for measuring the three-dimensional surface area A.

In still another embodiment of the copper foil according to the invention, the copper foil has an average crystal grain size of 20 µm or more on a cross section in parallel to a thickness direction of the copper foil and in parallel to MD of the copper foil, after forming a copper-clad laminate board containing the copper foil having adhered thereto an insulating substrate.

In still another embodiment of the copper foil according to the invention, the copper foil is a rolled copper foil.

In still another embodiment of the copper foil according to the invention, the copper foil is for attaching to a resin having a dielectric constant of 3.5 or less.

In still another embodiment of the copper foil according to the invention, the copper foil is for attaching to a liquid crystal polymer or a fluorine resin or a low induction polyimide resin.

In still another embodiment of the copper foil according to the invention, the copper foil is used in a copper-clad laminate board or a printed wiring board that is used under a high frequency exceeding 1 GHz.

In still another embodiment of the copper foil according to the invention, the copper foil contains, on a surface of the copper foil, one or more layers selected from the group consisting of a roughening treatment layer, a heat resistance treatment layer, a rust prevention treatment layer, a chromate treatment layer, and a silane coupling treatment layer.

In still another embodiment of the copper foil according to the invention, the copper foil contains, on a surface of the copper foil, one or more layers selected from the group consisting of a heat resistance treatment layer, a rust prevention treatment layer, a chromate treatment layer, and a silane coupling treatment layer.

In still another embodiment of the copper foil according to the invention, the copper foil contains a heat resistance treatment layer or a rust prevention treatment layer on a surface of the copper foil, contains a chromate treatment layer on the heat resistance treatment layer or the rust prevention treatment layer, and contains a silane coupling treatment layer on the chromate treatment layer.

In still another embodiment of the copper foil according to the invention, the copper foil contains a heat resistance treatment layer on a surface of the copper foil, contains a rust prevention treatment layer on the heat resistance treatment layer, contains a chromate treatment layer on the rust prevention treatment layer, and contains a silane coupling treatment layer on the chromate treatment layer.

In still another embodiment of the copper foil according to the invention, the copper foil contains a chromate treatment layer on a surface of the copper foil, and contains a silane coupling treatment layer on the chromate treatment layer.

In still another embodiment of the copper foil according to the invention, the copper foil contains a roughening treatment layer on a surface of the copper foil, contains a chromate treatment layer on the roughening treatment layer, and contains a silane coupling treatment layer on the chromate treatment layer.

In still another embodiment of the copper foil according to the invention, the copper foil contains a roughening treatment layer on a surface of the copper foil, contains one or more layers selected from the group consisting of a rust prevention treatment layer and a heat resistance treatment layer on the roughening treatment layer, contains a chromate treatment layer on the one or more layers selected from the group consisting of a rust prevention treatment layer and a heat resistance treatment layer, and contains a silane coupling treatment layer on the chromate treatment layer.

In still another embodiment of the copper foil according to the invention, the copper foil contains a roughening treatment layer on a surface of the copper foil, contains a rust prevention treatment layer on the roughening treatment layer, contains a chromate treatment layer on the rust prevention treatment layer, and contains a silane coupling treatment layer on the chromate treatment layer.

In still another embodiment of the copper foil according to the invention, the copper foil contains a roughening treatment layer on a surface of the copper foil, and contains a silane coupling treatment layer on the roughening treatment layer.

In still another embodiment of the copper foil according to the invention, the copper foil contains a silane coupling treatment layer on a surface of the copper foil.

The invention relates to, in still another aspect, a copper-clad laminate board containing the copper foil according to the invention and an insulating substrate that are adhered to each other.

In one embodiment of the copper-clad laminate board according to the invention, the copper-clad laminate board is used under a high frequency exceeding 1 GHz.

The invention relates to, in still another aspect, a copper-clad laminate board containing a copper foil and an insulating substrate that are adhered to each other, the copper-clad laminate board having a number of times of folding of 1 or more in a folding test under a prescribed condition.

The invention relates to, in still another aspect, a copper-clad laminate board containing a copper foil and an insulating substrate that are adhered to each other, the copper foil having a number of cracks having a depth of 1 μm or more from a surface of the copper foil being 3 or less after a sliding bending test in a prescribed number of times under a prescribed condition for the copper-clad laminate board, in an observation of a region having a size of a thickness of the copper foil×100 μm on a cross section of the copper foil in parallel to a sliding direction in the sliding bending test.

The invention relates to, in still another aspect, a copper-clad laminate board containing a copper foil and an insulating substrate that are adhered to each other, the copper foil having a number of cracks having a depth of 2 μm or more from a surface of the copper foil being 2 or less after a sliding bending test in a prescribed number of times under a prescribed condition for the copper-clad laminate board, in an observation of a region having a size of a thickness of the copper foil×100 μm on a cross section of the copper foil in parallel to a sliding direction in the sliding bending test.

In one embodiment of the copper-clad laminate board according to the invention, the insulating substrate is any one of the following insulating substrates (H) to (J)

(H) a fluorine resin, (I) a polyimide resin having a dielectric dissipation factor of 0.01 or less, and (J) a liquid crystal polymer resin.

The invention relates to, in still another aspect, a method for producing a printed wiring board, containing using the copper-clad laminate board according to the invention.

The invention relates to, in still another aspect, a method for producing an electronic apparatus, containing using a printed wiring board produced by the production method according to the invention.

The invention relates to, in still another aspect, a method for producing a transmission channel, containing using the copper-clad laminate board according to the invention, the transmission channel being used under a high frequency exceeding 1 GHz.

The invention relates to, in still another aspect, a method for producing an antenna, containing using the copper-clad laminate board according to the invention, the antenna being used under a high frequency exceeding 1 GHz.

According to the invention, a copper foil and a copper-clad laminate board can be provided that have a favorably suppressed transmission loss even in the use thereof in a high frequency circuit board that is folded in use or bent in use.

DESCRIPTION OF THE EMBODIMENTS

Figure 1:
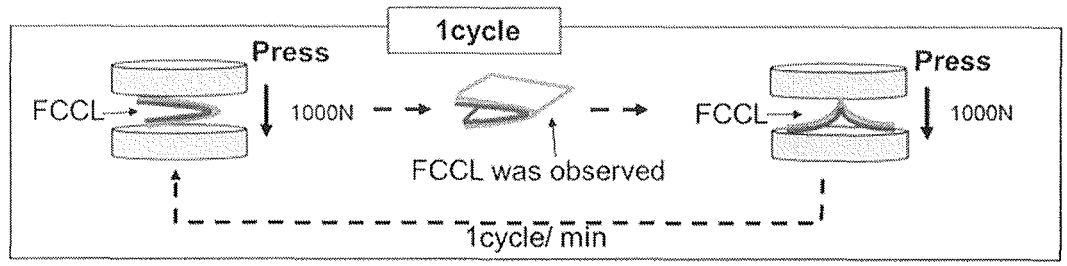
FIG. 1 is a schematic illustration showing the test for evaluating the number of times of folding in the examples.

The invention relates to, as one aspect, a copper foil having a number of times of folding of 1 or more in a folding test under a prescribed condition for a copper-clad laminate board containing the copper foil having adhered thereto an insulating substrate (the copper foil having an insulating substrate adhered to the copper foil).

According to the constitution, the formation of cracks in the copper foil can be favorably suppressed even in the case where the copper-clad laminate board is folded in use, and thereby the transmission loss can be favorably suppressed in the use thereof in a high frequency board.

The number of times of folding is, preferably 1.2 or more, preferably 1.5 or more, preferably 2 or more, preferably 2.2 or more, preferably 2.5 or more, preferably 3 or more, preferably 3.2 or more, preferably 3.5 or more, and preferably 4 or more.

The number of times of folding can be controlled by the arithmetic average roughness Ra and the ten-point average roughness Rz in TD of the copper foil and the surface area ratio of the copper foil. Specifically, the arithmetic average surface roughness Ra may be controlled to a range of from 0.05 to 0.4 μm, the ten-point average roughness Rz may be controlled to a range of from 0.25 to 2.0 μm, and the surface area ratio may be controlled to a range of from 1.5 to 3.0. In the case where Ra is less than 0.05 μm, Rz is less than 0.25 μm, or the surface area ratio is less than 1.5, the copper foil and the resin may be released from each other in a folding process due to the low adhesiveness between the resin and the copper foil, so as to concentrate the bending stress to the copper foil, and thereby cracks tend to occur in the copper foil. In the case where Ra exceeds 0.4 μm, Rz exceeds 2.0 μm, or the surface area ratio exceeds 3.0, the stress concentration may occur due to the probability of the presence of deep valleys, and thereby cracks tend to occur in some cases.

For the aforementioned control of the arithmetic average roughness Ra and the ten-point average roughness Rz in TD of the copper foil, in the case where the surface in TD of the copper foil is subjected to a roughening treatment, for example, Ra and Rz can be increased by increasing the current density of the roughening treatment or by increasing the treatment time of the roughening treatment, and Ra and Rz can be decreased by decreasing the current density of the roughening treatment or by decreasing the treatment time of the roughening treatment. A lower limit of the arithmetic average roughness Ra is preferably 0.05 μm or more, preferably from 0.06 μm or more, preferably 0.07 μm or more, and preferably 0.08 μm or more. An upper limit of the arithmetic average roughness Ra is preferably 0.35 μm or less, preferably 0.32 μm or less, preferably 0.30 μm or less, preferably 0.28 μm or less, preferably 0.25 μm or less, and preferably 0.20 μm or less. A lower limit of the ten-point average roughness Rz is preferably 0.25 μm or more, preferably 0.30 μm or more, preferably 0.35 μm or more, preferably 0.40 μm or more, preferably 0.45 μm or more, and preferably 0.50 μm or more. An upper limit of the ten-point average roughness Rz is preferably 1.8 μm or less, preferably 1.7 μm or less, preferably 1.6 μm or less, preferably 1.5 μm or less, preferably 1.3 μm or less, preferably 1.2 μm or less, preferably 1.1 μm or less, and preferably 1.0 μm or less.

For the aforementioned control of the arithmetic average roughness Ra and the ten-point average roughness Rz in TD of the copper foil, in the case where the copper foil is a rolled copper foil, the arithmetic average roughness Ra in TD of the copper foil can be increased by increasing the arithmetic average roughness Ra of the surface of the rolling mill roll used in the final cold rolling, and the arithmetic average roughness Ra in TD of the copper foil can be decreased by decreasing the arithmetic average roughness Ra of the surface of the rolling mill roll. Furthermore, the ten-point average roughness Rz in TD of the copper foil can be increased by increasing the ten-point average roughness Rz of the surface of the rolling mill roll used in the final cold rolling, and the ten-point average roughness Rz in TD of the copper foil can be decreased by decreasing the ten-point average roughness Rz of the surface of the rolling mill roll. The Ra and/or Rz of the surface of the rolling mill roll can be controlled by changing the abrasive grains of the abrasive agent for polishing the surface of the rolling mill roll or by performing shot blasting or the like. The Ra in TD of the copper foil and/or the Rz in TD of the copper foil can be decreased by increasing the rolling reduction in the final cold rolling, and the Ra in TD of the copper foil and/or the Rz in TD of the copper foil can be increased by decreasing the rolling reduction in the final cold rolling. The arithmetic average roughness Ra of the rolling mill roll may be from 0.05 to 0.5 μm, and/or the ten-point average roughness Rz thereof may be from 0.20 to 2.0 μm.

For the aforementioned control of the surface area ratio of the copper foil, in the case where the surface in TD of the copper foil is subjected to a roughening treatment, for example, the surface area ratio can be increased by decreasing the size of the roughening particles since the frequency of irregularities on the surface of the copper foil after the roughening treatment may be increased, and the surface area ratio can be decreased by increasing the size of the roughening particles since the frequency of irregularities on the surface of the copper foil after the roughening treatment may be decreased. The size of the roughening particles can be controlled by any known method. The size of the roughening particles can be decreased by increasing the current density of the roughening treatment and by decreasing the treatment time of the roughening treatment, and the size of the roughening particles can be increased by decreasing the current density of the roughening treatment and by increasing the treatment time of the roughening treatment. A lower limit of the surface area ratio is preferably 1.6 or more, preferably 1.7 or more, preferably 1.8 or more, preferably 1.9 or more, and preferably 2.0 or more. An upper limit of the surface area ratio is preferably 2.9 or less, preferably 2.8 or less, preferably 2.7 or less, preferably 2.6 or less, preferably 2.5 or less, preferably 2.45 or less, preferably 2.4 or less.

For the aforementioned control of the surface area ratio of the copper foil, in the case where the copper foil is a rolled copper foil, the surface area ratio of the copper foil after the final cold rolling can be increased by increasing the value of oil film equivalent amount in the final cold rolling, and the surface area ratio of the copper foil after the final cold rolling can be decreased by decreasing the value of the oil film equivalent amount in the final cold rolling. The oil film equivalent amount is shown by the following expression.

(oil film equivalent amount)=((viscosity of rolling oil (cSt))×((rolling speed (mpm))+(rolling peripheral velocity (mpm)))/((bite angle of roll (rad))× (yield stress of material (kg/mm$^2$)))

The viscosity (cSt) of the rolling oil is the kinetic viscosity thereof at 40° C. The value of the oil film equivalent amount may be from 10,000 to 50,000. The value of the surface area ratio of the copper foil can be decreased by increasing the rolling reduction in the final cold rolling, and the value of the surface area ratio of the copper foil can be increased by decreasing the rolling reduction in the final cold rolling.

The invention relates to, as another aspect, a copper foil having a number of cracks having a depth of 1 μm or more from a surface of the copper foil being 3 or less after a sliding bending test in a prescribed number of times under a prescribed condition for a copper-clad laminate board containing the copper foil having adhered thereto an insulating substrate (the copper foil having an insulating substrate adhered to the copper foil), in an observation of a region having a size of a thickness of the copper foil×100 μm on a cross section of the copper foil in parallel to a sliding direction in the sliding bending test. The number of the cracks is preferably 2.8 or less, preferably 2.5 or less, preferably 2 or less, preferably 1.8 or less, preferably 1.5 or less, preferably 1 or less, preferably 0.8 or less, preferably 0.5 or less, preferably 0.1 or less, and preferably 0.

According to the constitution, the formation of cracks in the copper foil can be favorably suppressed even in the case where the copper-clad laminate board is bent in use, and thereby the transmission loss can be favorably suppressed in the use thereof in a high frequency board.

The invention relates to, as still another aspect, a copper foil having a number of cracks having a depth of 2 μm or more from a surface of the copper foil being 2 or less after a sliding bending test in a prescribed number of times under a prescribed condition for a copper-clad laminate board containing the copper foil having adhered thereto an insulating substrate, in an observation of a region having a size of a thickness of the copper foil×100 μm on a cross section of the copper foil in parallel to a sliding direction in the sliding bending test. The number of the cracks is preferably 1.8 or less, preferably 1.5 or less, preferably 1 or less, preferably 0.8 or less, preferably 0.5 or less, preferably 0.1 or less, and preferably 0.

According to the constitution, the formation of cracks in the copper foil can be favorably suppressed even in the case where the copper-clad laminate board is bent in use, and thereby the transmission loss can be favorably suppressed in the use thereof in a high frequency board.

The cracks can be decreased by making the average crystal grain size on a cross section in parallel to MD (Machine Direction, traveling direction of the copper foil in a copper foil manufacturing equipment, the rolling direction of the copper foil when the copper foil is a rolled copper foil) and in parallel to the thickness direction thereof to 20 μm or more. In the case where the average crystal grain size is less than 20 μm, there may be cases where due to the large number of the crystal grain boundaries, the probability of the formation of cracks from the crystal grain boundaries as starting point is increased. A lower limit of the average crystal grain size on a cross section in parallel to MD and in parallel to the thickness direction thereof is preferably 25 μm or more, preferably 30 μm or more, preferably 35 μm or more, preferably 40 μm or more, preferably 45 μm or more, preferably 50 μm or more, preferably 55 μm or more, preferably 60 μm or more, preferably 65 μm or more, preferably 70 μm or more, preferably 75 μm or more, preferably 80 μm or more, preferably 85 μm or more, preferably 90 μm or more, preferably 95 μm or more, preferably 100 μm or more, preferably 105 μm or more, preferably 110 μm or more, preferably 115 μm or more, preferably 120 μm or more, preferably 125 μm or more, preferably 130 μm or more, preferably 135 μm or more, preferably 140 μm or more, preferably 145 μm or more, preferably 150 μm or more, preferably 155 μm or more, and preferably 160 μm or more. An upper limit of the average crystal grain size on a cross section in parallel to MD and in parallel to the thickness direction thereof may not be necessarily determined, and is typically, for example 1000 μm or less, for example 900 μm or less, for example 800 μm or less, for example 700 μm or less, for example 600 μm or less, for example 500 μm or less, for example 450 μm or less, and for example 400 μm or less.

The average crystal grain size can be controlled to 20 μm or more by adding an additional element that tends to increase the size of the crystal grains. Examples of the additional element include Ag and Sn, and the concentration of the additional element may be from 10 to 500 ppm by mass. The average crystal grain size can also be controlled by increasing the rolling reduction (for example, 95% or more) in the final cold rolling in the production of the copper foil. The average crystal grain size can also be controlled by decreasing the average crystal grain size (for example, 10 μm or less) before the final cold rolling in the production of the copper foil.

The rolling reduction is shown by the following expression.

(rolling reduction (%))=$(t_0-t)/t_0 \times 100$ (%)

wherein $t_0$ represents the thickness before rolling, and t represents the thickness after rolling.

The copper foil that can be used in the invention (i.e., the raw foil) is not particularly limited in the kind thereof, and examples thereof include a high purity copper, such as a tough pitch copper (JIS H3100, alloy number: C1100, which may be hereinafter referred to as "TPC"), an oxygen-free copper (JIS H3100, alloy number: C1020, or JIS H3510, alloy number: C1011, which may be hereinafter referred to as "OFC"), a phosphorus-deoxidized copper (JIS H3100, alloy number: C1201, C1220, or C1221), and an electrolytic copper, and also include a copper alloy, such as a Sn-containing copper, an Ag-containing copper, a copper alloy containing Cr, Zr, Mg, or the like, and a Corson copper alloy containing Ni, Si, and the like. In the description herein, examples of the copper foil in the case where the term "copper alloy" is solely used include a copper alloy foil. The copper foil that can be used in the invention may be a copper foil containing one kind or two or more kinds selected from the group consisting of Sn, Mn, Cr, Zn, Zr, Mg, Ni, Si, P, B, Co, Fe, Ti, V, Al, Mo, Pd, Au, Ru, Rh, Os, Ir, Pt, In, and Ag in a total amount of from 30 to 500 ppm by mass with the balance of Cu and unavoidable impurities. A copper foil containing one kind or two or more kinds selected from the group consisting of Sn, Mn, Cr, Zn, Zr, Mg, Ni, Si, P, B, Co, and Ag in a total amount of from 30 to 500 ppm by mass with the balance of Cu and unavoidable impurities is more preferably used. A rolled copper foil and an electrolytic copper foil can be preferably used. The copper foil includes a pure copper foil and a copper alloy foil, which may have an arbitrary known composition for the purpose of forming a circuit.

In one embodiment, the copper foil according to the aspect of the invention may contain, on a surface of the copper foil, one or more layers selected from the group consisting of a roughening treatment layer, a heat resistance treatment layer, a rust prevention treatment layer, a chromate treatment layer, and a silane coupling treatment layer. In one embodiment, the copper foil according to the aspect of the invention may contain, on a surface of the copper foil, one or more layers selected from the group consisting of a heat resistance treatment layer, a rust prevention treatment layer, a chromate treatment layer, and a silane coupling treatment layer.

The roughening treatment layer is not particularly limited, and any of roughening treatment layers and the known roughening treatment layers may be applied thereto. The heat resistance treatment layer is not particularly limited, and any of heat resistance treatment layers and the known heat resistance treatment layers may be applied thereto. The rust prevention treatment layer is not particularly limited, and any of rust prevention treatment layers and the known rust prevention treatment layers may be applied thereto. The chromate treatment layer is not particularly limited, and any of chromate treatment layers and the known chromate treatment layers may be applied thereto. The silane coupling treatment layer is not particularly limited, and any of silane coupling treatment layers and the known silane coupling treatment layers may be applied thereto.

In one embodiment, the copper foil according to the aspect of the invention may contain, on a surface of the copper foil, a roughening treatment layer by subjecting the surface to a roughening treatment, for example, for enhancing the adhesiveness to an insulating substrate, and the like. The roughening treatment may be performed, for example, by forming roughening particles with copper or a copper alloy. The roughening treatment layer may be a layer formed of an elementary substance selected from the group consisting of copper, nickel, phosphorus, tungsten, arsenic, molybdenum, chromium, cobalt, and zinc, or an alloy containing one or more selected from the group, or the like. Roughening particles may be formed with copper or a copper alloy, and then a roughening treatment may further be performed by providing secondary particles or tertiary particles with an elementary substance or an alloy of nickel, cobalt, copper, or zinc, or the like. In particular, such a roughening treatment layer is preferred that contains a primary particle layer of copper, and a secondary particle layer formed of a ternary alloy of copper, cobalt, and nickel, formed on the primary particle layer.

In one embodiment of the copper foil according to the aspect of the invention, after performing the roughening treatment, a heat resistance treatment layer or a rust prevention treatment layer may be formed with an elementary substance or an alloy of nickel, cobalt, copper, or zinc, or the like, and a chromate treatment, a silane coupling treatment, and the like may be further performed on the surface of the heat resistance treatment layer or the rust prevention treatment layer. In alternative, without performing the roughening treatment, a heat resistance treatment layer or a rust prevention treatment layer may be formed with an elementary substance or an alloy of nickel, cobalt, copper, or zinc, or the like, and a chromate treatment, a silane coupling treatment, and the like may be further performed on the surface of the heat resistance treatment layer or the rust prevention treatment layer.

Specifically, one or more layers selected from the group consisting of a heat resistance treatment layer, a rust prevention treatment layer, a chromate treatment layer, and a silane coupling treatment layer may be formed on the surface of the roughening treatment layer, and one or more layers selected from the group consisting of a heat resistance treatment layer, a rust prevention treatment layer, a chromate treatment layer, and a silane coupling treatment layer may be formed on the surface of the copper foil. The heat resistance treatment layer, the rust prevention treatment layer, the chromate treatment layer, and the silane coupling treatment layer each may be formed of plural layers (for example, two or more layers, or three or more layers). In the aspect of the invention, the "rust prevention treatment layer" includes the "chromate treatment layer". In consideration of the adhesiveness to a resin, a silane coupling layer is preferably provided as the outermost layer of the copper foil. The roughening treatment layer, the heat resistance treatment layer, the rust prevention treatment layer, the chromate treatment layer, and the silane coupling treatment layer may be a known roughening treatment layer, a known heat resistance treatment layer, a known rust prevention treatment layer, a known chromate treatment layer, and a known silane coupling treatment layer, respectively.

Examples of the rust prevention treatment or the chromate treatment include the following treatments.

Ni Plating
  Composition of solution: Ni ion: 10 to 40 g/L
  pH: 1.0 to 5.0
  Temperature of solution: 30 to 70° C.
  Current density: 1 to 9 A/dm$^2$
  Energizing time: 0.1 to 3 sec
Ni—Co Plating (Ni—Co Alloy Plating)
  Composition of solution: Co: 1 to 20 g/L, Ni: 1 to 20 g/L
  pH: 1.5 to 3.5
  Temperature of solution: 30 to 80° C.
  Current density: 1 to 20 A/dm$^2$
  Energizing time: 0.5 to 4 sec
Zn—Ni Plating (Zn—Ni Alloy Plating)
  Composition of solution: Zn: 10 to 30 g/L, Ni: 1 to 10 g/L
  pH: 3 to 4
  Temperature of solution: 40 to 50° C.
  Current density: 0.5 to 5 A/dm$^2$
  Energizing time: 1 to 3 sec
Ni—Mo Plating (Ni—Mo Alloy Plating)
  Composition of solution: nickel sulfate: 270 to 280 g/L, nickel chloride: 35 to 45 g/L, nickel acetate: 10 to 20 g/L, molybdenum (added as sodium molybdate): 0.1 to 10 g/L, trisodium citrate: 15 to 25 g/L, gloss agent: saccharin, butynediol, or the like, sodium dodecyl sulfate: 55 to 75 ppm
  pH: 4 to 6
  Temperature of solution: 55 to 65° C.
  Current density: 1 to 11 A/dm$^2$
  Energizing time: 1 to 20 sec
Cu—Zn Plating (Cu—Zn Alloy Plating)
  Composition of solution: NaCN: 10 to 30 g/L, NaOH: 40 to 100 g/L, Cu: 60 to 120 g/L, Zn: 1 to 10 g/L
  Temperature of solution: 60 to 80° C.
  Current density: 1 to 10 A/dm$^2$
  Energizing time: 1 to 10 sec
Electrolytic Chromate
  Composition of solution: chromic anhydride, chromic acid, or potassium bichromate: 1 to 10 g/L, zinc (added as zinc sulfate when added): 0 to 5 g/L
  pH: 0.5 to 10
  Temperature of solution: 40 to 60° C.
  Current density: 0.1 to 2.6 A/dm$^2$
  Coulomb amount: 0.5 to 90 As/dm$^2$
  Energizing time: 1 to 30 sec
Immersion Chromate
  Composition of solution: chromic anhydride, chromic acid, or potassium bichromate: 1 to 10 g/L, zinc (added as zinc sulfate when added): 0 to 5 g/L
  pH: 2 to 10
  Temperature of solution: 20 to 60° C.
  Treatment time: 1 to 30 sec The silane coupling agent used in the silane coupling treatment for forming the silane coupling treatment layer may be a known silane coupling agent, and examples thereof used include an amino silane coupling agent, an epoxy silane coupling agent, and a mercapto silane coupling agent. Examples of the silane coupling agent include vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β-(aminoethyl)-γ-aminopropyltrimethoxysilane, N-3-(4-(3-aminopropoxy)butoxy)propyl)-3-aminopropyltrimeth oxysilane, imidazole silane, triazine silane, and γ-mercaptopropyltrimethoxysilane.

The silane coupling treatment layer may be formed by using a silane coupling agent, such as an epoxy silane, an amino silane, a methacryloxy silane, and a mercapto silane. The silane coupling agents may be a mixture of two or more kinds thereof. Among these, the silane coupling treatment layer is preferably formed by using an amino silane coupling agent or an epoxy silane coupling agent.

The amino silane coupling agent used herein may be selected from the group consisting of N-(2-aminoethyl)-3-aminopropyltrimethoxysilane, 3-(N-stylylmethyl-2-aminoethylamino)propyltrimethoxysilane, 3-aminopropyltriethoxysilane, bis(2-hydroxyethyl)-3-aminopropyltriethoxysilane, aminopropyltrimethoxysilane, N-methylaminopropyltrimethoxysilane, N-phenylaminopropyltrimethoxysilane, N-(3-acryloxy-2-hydroxypropyl)-3-aminopropyltriethoxysilane, 4-aminobutyltriethoxysilane, (aminoethylaminomethyl)phenethyltrimethoxysilane, N-(2-aminoethyl-3-aminopropyl)trimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, ω-aminoundecyltrimethoxysilane, 3-(2-N-benzylaminoethylaminopropyl)trimethoxysilane, bis(2-hydroxyethyl)-3-aminopropyltriethoxysilane, (N,N-diethyl-3-aminopropyl)trimethoxysilane, (N,N-dimethyl-3-aminopropyl)trimethoxysilane, N-methylaminopropyltrimethoxysilane, N-phenylaminopropyltrimethoxysilane, 3-(N-stylylmethyl-2-aminoethylamino)propyltrimethoxysilane, γ-aminopropyltriethoxysilane, N-β-(aminoethyl)-γ-aminopropyltrimethoxysilane, and N-3-(4-(3-aminopropoxy)butoxy)propyl-3-aminopropyltrimethoxysilane.

The silane coupling treatment layer is preferably provided in an amount in terms of silicon atoms in a range of from 0.05 to 200 mg/m$^2$, preferably from 0.15 to 20 mg/m$^2$, and preferably from 0.3 to 2.0 mg/m$^2$. In the case where the amount thereof is in the range, the adhesiveness between an insulating substrate and the copper foil can be enhanced.

A copper-clad laminate board can be formed by adhering the copper foil according to the aspect of the invention to an insulating substrate. The copper-clad laminate board may be a single layer copper-clad laminate board containing an insulating substrate having a single layer structure, or a multilayer copper-clad laminate board containing two or more layers of insulating substrates. The copper-clad laminate board may be a flexible board or a rigid board. The insulating substrate is not particularly limited, and examples thereof include insulating substrates formed of an epoxy resin, a phenol resin, a polyimide resin, a polyamideimide resin, a polyester resin, a polyphenylene sulfide resin, a polyether imide resin, a fluorine resin, a liquid crystal polymer (LCP), and mixtures thereof. Examples of the insulating substrate also include an insulating substrate formed of a glass cloth impregnated with an epoxy resin, a bismaleimide triazine resin, a polyimide resin, or the like. A publicly known insulating substrate may be used as the insulating substrate. Among these, a liquid crystal polymer or a fluorine resin or a low induction polyimide resin are suitable for a purpose under a high frequency due to the remarkable advantages thereof including a low dielectric constant, a low dielectric dissipation factor, a low water absorbing property, and a small change in electric characteristics, and further including a small dimensional change. The copper foil according to the aspect of the invention is useful as a copper foil for a flexible printed circuit board (FPC) that contains a liquid crystal polymer having a copper foil laminated thereon. The copper-clad laminate board according to the aspect of the invention has good circuit formability, has a copper foil having a transmission loss that is favorably suppressed in the use thereof in a high frequency circuit board, and is particularly effective in an application under a high frequency exceeding 1 GHz.

In the description herein, a polyimide resin having a dissipation factor of 0.01 or less is referred to as a low induction polyimide resin. The dissipation factor of the polyimide resin is preferably 0.008 or less, preferably 0.006 or less, preferably 0.005 or less, preferably 0.004 or less, and preferably 0.003 or less. A lower limit of the dissipation factor of the polyimide resin may not be necessarily determined, and is typically, for example 0 or more, for example 0.000001 or more, for example 0.000005 or more, for example 0.00001 or more, for example 0.00005 or more, and for example 0.0001 or more. The dissipation factor can be measured according to JPCA-TM001-2007 "Test method for copper-clad laminates for printed wiring boards dielectric constant and dissipation factor" by Japan Electronics Packaging and Circuits Association, by the triplate resonator method. The copper-clad laminate board may be produced by laminating the copper foil and an insulating substrate with adhesive. A publicly known adhesive may be used as the adhesive. The adhesive is preferably an adhesive having low dielectric constant. In the description herein, an adhesive having a dielectric constant of 3.5 or less is referred to as an adhesive having low dielectric constant. The dielectric constant of the adhesive is preferably 3.4 or less, preferably 3.3 or less, preferably 3.2 or less, preferably 3.1 or less, preferably 3.0 or less, preferably 2.9 or less, and preferably 2.5 or less. In the description herein, a value of dielectric constant (base material dielectric constant, substrate dielectric constant, dielectric constant of resin) means a value of dielectric constant wherein signal frequency is 1 GHz, and a value of dielectric dissipation factor (base material dielectric dissipation factor, substrate dielectric dissipation factor, dielectric dissipation factor of resin) means a value of dielectric dissipation factor wherein signal frequency is 1 GHz.

The invention relates to, in still another aspect, a copper-clad laminate board containing a copper foil and an insulating substrate that are adhered to each other, the copper-clad laminate board having a number of times of folding of 1 or more in a folding test under a prescribed condition.

According to the constitution, the formation of cracks in the copper foil can be favorably suppressed even in the case where the copper-clad laminate board is bent in use, and thereby the transmission loss can be favorably suppressed in the use thereof in a high frequency board.

The invention relates to, in still another aspect, a copper-clad laminate board containing a copper foil and an insulating substrate that are adhered to each other, the copper foil having a number of cracks having a depth of 1 µm or more from a surface of the copper foil being 3 or less after a sliding bending test in a prescribed number of times under a prescribed condition for the copper-clad laminate board, in an observation of a region having a size of a thickness of the copper foil×100 µm on a cross section of the copper foil in parallel to a sliding direction in the sliding bending test.

The invention relates to, in still another aspect, a copper-clad laminate board containing a copper foil and an insulating substrate that are adhered to each other, the copper foil having a number of cracks having a depth of 2 µm or more from a surface of the copper foil being 2 or less after a sliding bending test in a prescribed number of times under a prescribed condition for the copper-clad laminate board, in an observation of a region having a size of a thickness of the copper foil×100 µm on a cross section of the copper foil in parallel to a sliding direction in the sliding bending test.

According to the constitution, the formation of cracks in the copper foil can be favorably suppressed even in the case where the copper-clad laminate board is bent in use, and thereby the transmission loss can be favorably suppressed in the use thereof in a high frequency board.

A printed wiring board can be produced by using the copper-clad laminate board. The method for producing a printed wiring board from the copper-clad laminate board is not particularly limited, and it suffices to use a known etching process. A printed circuit board can be produced by mounting various electronic components on the printed wiring board. In the description herein, the printed circuit board is included in the printed wiring board. The printed wiring board can be mounted on various electronic apparatuses.

The copper-clad laminate board according to the aspect of the invention can be used particularly favorably in a transmission channel, an antenna, and the like that are used under a high frequency exceeding 1 GHz.

EXAMPLE

The invention will be described with reference to examples shown below. The examples show only preferred examples and do not limit the invention in any way. Accordingly, all modifications, examples, and embodiments within the technical concept of the invention are included in the invention. Comparative examples will also be shown below for the comparison to the invention. The balances of the liquids used in the roughening treatment, the plating, the silane coupling treatment, the heat resistance treatment, the rust prevention treatment, and the like described in the experimental examples described herein each are water unless otherwise indicated.

For copper foils of Examples 1 to 14 and Comparative Examples 1 to 13, ingots having the compositions shown in the column "Composition of copper foil" in Table 1 were manufactured. The ingots each were hot-rolled from 900° C., and then repeatedly subjected to cold rolling and annealing, and the resulting copper foil was finally subjected to final cold rolling to provide a rolled copper foil having the thickness shown in Table 1. The rolling reductions in the final cold rolling are shown in Table 1. The oil film equivalent amount in the final cold rolling was from 12,000 to 36,000. The arithmetic average roughness Ra of the surface of the rolling mill roll was from 0.1 to 0.2 µm. In the column "Composition of copper foil", TCP means a tough pitch copper, and OFC means an oxygen-free copper. For example, "100 ppm Ag-OFC" in Example 10 means that 100 ppm by mass of Ag is added to an oxygen-free copper, and "200 ppm Ag-TPC" in Example 7 means that 200 ppm by mass of Ag is added to a tough pitch copper. The electrolytic copper foils in Comparative Examples were produced in the following manner.

Electrolytic copper foils having the thicknesses shown in Table 1 were produced in the following conditions as the copper foils of Comparative Examples.

Composition of electrolytic solution: Cu (as $Cu^{2+}$): 100 g/L, $H_2SO_4$: 100 g/L, $Cl^-$: 100 mg/L, thiourea: 10 mg/L, SPS (disodium 3,3'-dithiobis(1-propanesulfonate)):50 to 100 mg/L Temperature of electrolytic solution: 50° C.

Current density: 30 $A/dm^2$

Thereafter, the copper foil was subjected to the surface treatment under the conditions shown in Tables 1 and 2, and the resin shown in Table 1 was laminated by adhering to the surface-treated of the copper foil to provide a copper-clad laminate board. The "surface-treated surface" of the copper foil means the surface of the copper foil that is subjected to the surface treatment. In the case where the copper foil is subjected to plural surface treatments, the "surface-treated surface" means the surface subjected to the final surface treatment, i.e., the outermost surface. The temperature and the condition for the lamination with the resin are shown in Table 1.

The resins shown in the column "Kind of resin" in Table 1 are as follows.

PTFE: a fluorine resin, a polytetrafluoroethylene resin

Low dielectric PI: a polyimide resin having a dielectric dissipation factor of 0.002. Low dielectric PI is laminated to the copper foil with low dielectric constant adhesive.

LCP: a liquid crystal polymer, a copolymer of a hydroxybenzoate ester and a hydroxynaphthoate ester, Vecstar CT-Z, available from Kuraray Co., Ltd.

COP: a cycloolefin polymer resin. COP is laminated to the copper foil with low dielectric constant adhesive.

PET: a polyethylene terephthalate resin. PET is laminated to the copper foil with low dielectric constant adhesive.

For the surface treatment conditions 1 to 6 shown in Table 2, primary particles were firstly formed, and then secondary particles were formed with a secondary particle plating solution (A). For the formation of the primary particles, a plating treatment was performed with the primary particle plating solution (I) shown in Table 2, and subsequently a plating treatment was performed with the primary particle plating solution (II) shown in Table 2. The surface treatments with the surface treatment conditions 1 to 6 correspond to the roughening treatment.

For the surface treatment condition 7 shown in Table 2, a cover plating treatment was performed with a Ni—Co plating solution under the condition shown in Table 2, and for the surface treatment condition 8 shown in Table 2, a cover plating treatment was performed with a Ni plating solution under the condition shown in Table 2.

The description "5+8" shown in the column "Surface treatment condition No." in Table 1 means that a treatment of the surface treatment condition 5 is performed, and then a treatment of the surface treatment condition 8 is performed.

In Examples 2 and 3, the surface treatment shown in the column "Surface treatment condition No." was performed, and then the chromate treatment and the silane coupling treatment shown below were performed in this order.

Chromate Treatment

Composition of solution: potassium bichromate: 1 to 10 g/L, zinc (added as zinc sulfate): 0.01 to 5 g/L pH: 0.5 to 10

Temperature of solution: 40 to 60° C.

Current density: 0.1 to 2.6 A/dm$^2$

Coulomb amount: 0.5 to 90 As/dm$^2$

Energizing time: 1 to 30 sec

Silane Coupling Treatment

The treatment was performed by coating a silane coupling agent by spraying a solution of pH 7 to 8 containing from 0.2 to 2% by weight of an alkoxysilane.

Measurement of Arithmetic Average Roughness Ra and Ten-point Average Roughness Rz The surface of the copper foil on the side to be laminated with the resin after subjecting to the surface treatment (i.e., the surface-treated surface) was measured for the arithmetic average roughness (Ra) and the ten-point average roughness (Rz) in TD (i.e., the transverse direction, the width direction, or the direction perpendicular to the traveling direction of the copper foil (i.e., the machine direction, MD) in the copper foil production equipment) according to JIS B0601-1982 with a stylus roughness meter, Surf corder SE-3C, available from Kosaka Laboratory Ltd. The arithmetic average roughness Ra and the ten-point average roughness Rz each were measured for 10 arbitrary positions, and the average values of the Ra and the Rz obtained by the measurement for the 10 positions were designated as the values of the Ra and the Rz respectively.

Measurement of Surface Area Ratio

The surface of each of the copper foils on the side to be laminated with the resin after subjecting to the surface treatment (i.e., the surface-treated surface) in Examples and Comparative Examples was measured for the three-dimensional surface area A within a measurement view field corresponding to an area of 100 μm×100 μm (which was 9,924.4 μm$^2$ in terms of the actual data) at a magnification of 2,000 with a laser microscope (Laser Microscope VK8500, available from Keyence Corporation). The surface area ratio (A/B) was calculated based on the calculating expression, A/B=(three-dimensional surface area A)/(two-dimensional surface area B=9,924.4 μm$^2$). The two-dimensional surface area B herein means the area in a planar view of the measurement view field of the copper foil from the side to be laminated with the resin. The area ratio was measured for 10 arbitrary positions, and the average value of the surface area ratios obtained by the measurement for the 10 positions was designated as the surface area ratio.

Measurement of Dielectric Constant and Dielectric Dissipation Factor of Resin

After producing the copper-clad laminate board, the resin, wherein signal frequency is 1 GHz, was measured for the dielectric constant and the dielectric dissipation factor by the triplate resonator method according to JPCA-TM001-2007 "Test method for copper-clad laminates for printed wiring boards: dielectric constant and dissipation factor" by Japan Electronics Packaging and Circuits Association. The thickness of the resin used for the production of the copper-clad laminate board was 50 μm.

The copper-clad laminate board was measured for the number of times of folding in the folding test under the prescribed condition.

Evaluation of Number of Times of Folding

On the surface-treated surface of each of the copper foil of Examples and Comparative Examples, the resin shown in the column "Kind of resin" in Table 1 having a thickness of 50 μm was laminated under the temperature and time conditions shown in the column "Temperature and time on laminating copper foil and resin" in Table 1, so as to produce a copper-clad laminate board. The pressure on laminating the copper foil and the resin by pressing was 3.5 MPa when the resin was LCP, 4 MPa when the resin was Low dielectric PI, 5 MPa when the resin was PTFE, 1 MPa when the resin was PET, and 1.5 MPa when the resin was COP. In the case where the thickness of the copper foil was smaller than 12 μm, the copper foil after laminating on the resin to form the copper-clad laminate board was subjected to copper plating to make the total thickness of the copper foil and the copper plating of 12 μm. The condition of the copper plating was as follows.

Condition of Copper Plating

Composition of plating solution: concentration of copper: 100 g/L, concentration of sulfuric acid: 100 g/L Temperature of plating solution: 50° C.

Current density: 0.8 A/dm$^2$

In the case where the thickness of the copper foil was larger than 12 μm, the copper foil after laminating on the resin to form the copper-clad laminate board was etched to make the thickness of the copper foil of 12 μm.

The thickness of the copper foil was calculated by the following expression. The specimen of the copper foil had a size of 5 cm×5 cm square. When a size of the produced copper foil was small, a specimen having a smaller size than the said specimen can be used.

Thickness of copper foil (μm)=(weight of specimen of copper foil (g))/((area of specimen of copper foil, 25 (cm$^2$))×(density of copper, 8.94 (g/cm$^3$)))×10$^4$ (μm/cm)

The thickness of the copper foil after laminating the copper foil and the resin was calculated by the following expression. The specimen of the laminate of the copper foil and the resin had a size of 5 cm×5 cm square. When a size of the produced laminate was small, a specimen having a smaller size than the said specimen can be used to calculate the thickness of the copper foil.

A total thickness of the copper foil and the copper plating was calculated by the following expression, with replacing "thickness of copper foil (μm)" to "total thickness of the copper foil and the copper plating (μm)", and "copper foil" to "copper foil and copper plating" in the following expression.

Thickness of copper foil (μm)=((weight of specimen of the laminate of the copper foil and the resin before etching (g))−(weight of the resin after removing the copper foil entirely from the specimen by etching (g)))/((area of specimen of the laminate of the copper foil and the resin, 25 (cm$^2$))×(density of copper, 8.94 (g/cm$^3$)))×10$^4$ (μm/cm)

When a size of the produced laminate described above is small, on a cross section in parallel to a thickness direction of the copper foil, from a surface of the copper foil contacting the resin to a surface of the copper foil on the side opposite to the resin, by using FIB (FOCUSED ION BEAM MACHINING AND OBSERVATION APPARATUS), and the like, straight lines in parallel to a thickness direction of the copper foil are arbitrarily drawn at 10 points. And then, lengths of the lines at 10 points from the surface of the copper foil contacting the resin to the surface of the copper foil on the side opposite to the resin are measured. An average of the lengths of the lines at 10 points may be provided as the thickness of the copper foil in the field. By performing the said measurement three times, an average of the thicknesses of the copper foil in the three fields may be provided as the thickness of the copper foil.

Thereafter, a number of test pieces having a width of 12.7 mm and a length of 100 mm were cut out therefrom in such a manner that the width direction thereof was in parallel to TD, and the length direction thereof was in parallel to MD. Thereafter, the copper-clad laminate board was folded (180° contact folding) with the copper foil directed outward by pressing with a load of 1,000N in the direction of the folding axis in parallel to the width direction of the test piece and perpendicular to the length direction thereof, and then the presence of a crack in the copper foil was confirmed through the resin. In the case where a crack was observed, the cross section of the copper foil perpendicular to the folding axis and in parallel to the thickness direction thereof was observed to measure the length of the crack. In the case where the length of the crack was 3 μm or more, it was determined that a crack (harmful crack) was observed. In the case where the length of the crack was less than 3 μm, it was determined that no crack was observed. The number of times of the observation of a crack in the copper foil was designated as the number of times of folding of the copper foil or the copper-clad laminate board. In the case where no crack was observed, the folded copper-clad laminate board was again flattened by pressing with a load of 1,000 N as shown in FIG. 1. Thereafter, the copper-clad laminate board was again folded in the same manner as above. When the said observation of the cross section was performed to determine that no crack was observed because the length of the crack was less than 3 μm, the same evaluation was performed, by using a different test piece, with one more time of folding than the number of times of folding wherein it was determined that no crack was observed. The aforementioned evaluation was performed three times, and the average value of the number of times of folding in the three times evaluations was designated as the number of times of folding. For the length of the crack, the length of the line that was drawn following the crack from the surface of the copper foil on the cross sectional micrograph was designated as the crack length. The length of the line following the crack can be measured by using a commercially available image analyzing software or the like.

Average Crystal Grain Size of Copper Foil after Laminating on Resin

On the surface-treated surface of each of the copper foil of Examples and Comparative Examples, the resin shown in the column "Kind of resin" in Table 1 was laminated under the temperature and time conditions shown in the column "Temperature and time on laminating copper foil and resin" in Table 1, so as to produce a copper-clad laminate board. The pressure on laminating the copper foil and the resin by pressing was 3.5 MPa when the resin was LCP, 4 MPa when the resin was Low dielectric PI, 5 MPa when the resin was PTFE, 1 MPa when the resin was PET, and 1.5 MPa when the resin was COP. The copper foils of Examples and Comparative Examples each were measured for the average crystal grain size on the cross section in parallel to MD (i.e., the traveling direction of the copper foil in the copper foil production equipment) of the copper foil and in parallel to the thickness direction thereof by the section method (JIS H0501). In the section method, the direction of the line segment for measuring the average crystal grain size was in parallel to MD of the copper foil. The measurement was performed for three view fields, and the average value of the three view fields was designated as the average crystal grain size of the copper foil after laminating on the resin.

Evaluation of Number of Cracks

On one surface, i.e., the surface-treated surface of each of the copper foil of Examples 1 to 14 and Comparative Examples 1 to 13, the resin shown in the column "Kind of resin" in Table 1 having a thickness of 25 μm was laminated under the temperature and time conditions shown in the column "Temperature and time on laminating copper foil and resin" in Table 1, so as to produce a copper-clad laminate board. The pressure on laminating the copper foil and the resin by pressing was 3.5 MPa when the resin was LCP, 4 MPa when the resin was Low dielectric PI, 5 MPa when the resin was PTFE, 1 MPa when the resin was PET, and 1.5 MPa when the resin was COP. In the case where the thickness of the copper foil was smaller than 12 μm, the copper foil after laminating on the resin to form the copper-clad laminate board was subjected to copper plating to make the total thickness of the copper foil and the copper plating of 12 μm. The condition of the copper plating was as follows.

Condition of Copper Plating

Composition of plating solution: concentration of copper: 100 g/L, concentration of sulfuric acid: 100 g/L Temperature of plating solution: 50° C.

Current density: 0.2 A/dm$^2$

In the case where the thickness of the copper foil was larger than 12 μm, the copper foil after laminating on the resin to form the copper-clad laminate board was etched to make the thickness of the copper foil of 12 μm. In the case where the thickness of the copper foil was 12 μm, the thickness of the copper foil was not adjusted. The measuring methods of the thickness of the copper foil or the total thickness of the copper foil and the copper plating were the same with the said method. A test piece having a width of 12.7 mm and a length of 200 mm was cut out therefrom in such a manner that the width direction of the test piece was in parallel to TD of the copper foil, and the length direction of the test piece was in parallel to MD. Thereafter, a circuit having a circuit width of 300 μm and a space width between circuits of 300 μm (line and space L/S=300 μm/300 μm) was formed on the copper foil of the test piece by etching, so as to produce a flexible printed wiring board (FPC). The flexible printed wiring board thus produced was subjected to a sliding bending test in the prescribed number of times under the prescribed condition, and the number of cracks having a depth of 1 μm or more from the surface of the copper foil was measured by observing the region having a size of the thickness of the copper foil×100 μm on the cross section of the copper foil in parallel to the sliding direction in the sliding bending test. The sliding direction was in parallel to the length direction of the test piece (i.e., MD of the copper foil). The measurement was performed for three view fields each having a size of the thickness of the copper foil×100 μm, and the average number of cracks of the three view fields was designated as the number of cracks having a depth of 1 μm or more from the surface of the copper foil. The number of cracks having a depth of 2 μm or more from the surface of the copper foil was also measured. The measurement was performed for three view fields each having a size of the thickness of the copper foil×100 μm, and the average number of cracks of the three view fields was designated as the number of cracks having a depth of 2 μm or more from the surface of the copper foil. For the length of the crack, the length of the line that was drawn following the crack from the surface of the copper foil on the cross sectional micrograph was designated as the crack length. The length of the line following the crack can be measured by using a commercially available image analyzing software or the like. The condition of the sliding bending test was as follows.

Condition for Sliding and Bending Test

Bending radius: 1.5 mm

Stroke: 25 mm

Bending speed: 1,500 per min

Number of times of sliding and bending: 10,000

L/S: 300 μm/300 μm

Figure 4:
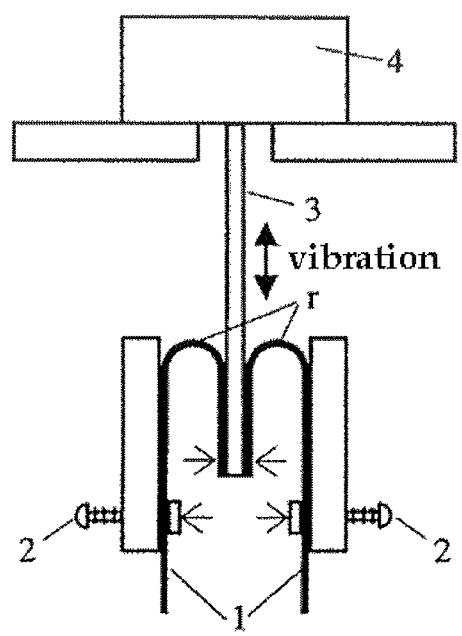
FIG. 4 is a schematic illustration showing the IPC bending test equipment in the examples.

The sliding bending test was performed by using an IPC (Institute for Printed Circuits, USA) bending test equipment shown in FIG. 4. The equipment has a structure containing an oscillation driver 4 having a vibration transmitting member 3 connected thereto, and the FPC 1 was fixed to the equipment at four positions shown by the arrows, i.e., the two screws 2 and the apical ends of the vibration transmitting member 3. With the vibration of the vibration transmitting member 3 in the vertical direction, the intermediate portion of the FPC 1 is bend in the form of a hairpin with a prescribed curvature radius r. The sliding and bending test was performed in such a manner that the surface of the FPC having the circuit thereon was directed inward of the bent portion with the curvature radius r shown in FIG. 4.

Transmission Loss after Producing Circuit and then Folding

A circuit was formed on a copper-clad laminate board produced by using each of the copper foils of Examples 1 to 14 and Comparative Examples 1 to 13, and the copper-clad laminate board was folded and then measured for the transmission loss. The copper-clad laminate board having a circuit used for the measurement was produced in the following manner.

Figure 2:
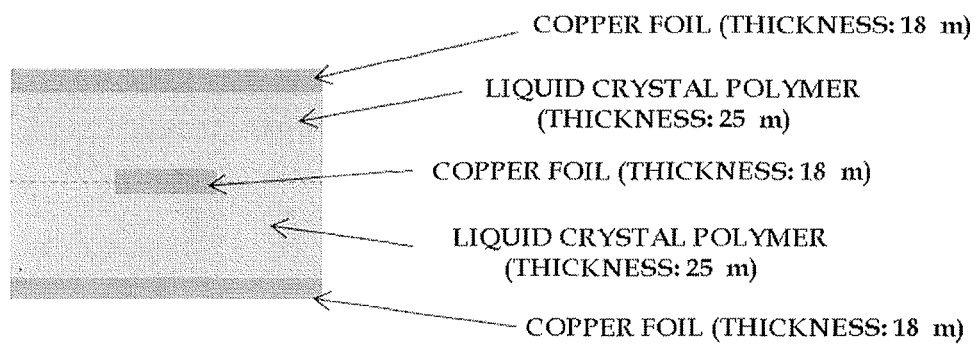
FIG. 2 is a schematic illustration showing the test for evaluating the transmission loss in the examples.

As shown in FIG. 2, on both surfaces of a resin shown in the column "Kind of resin" in Table 1 (a liquid crystal polymer, for example herein) having a thickness of 25 μm, the surface-treated surfaces of the copper foils of each of Examples and Comparative Examples were laminated by hot press under the temperature and time conditions shown in the column "Temperature and time on laminating copper foil and resin" in Table 1, so as to produce a copper-clad laminate board. The pressure on laminating the copper foil and the resin by pressing was 3.5 MPa when the resin was LCP, 4 MPa when the resin was Low dielectric PI, 5 MPa when the resin was PTFE, 1 MPa when the resin was PET, and 1.5 MPa when the resin was COP. Thereafter, in the case where the thickness of one or both of the copper foils was smaller than 18 μm, the surface of one or both of the copper foils was subjected to copper plating to make the thickness of one or both of the copper foils of 18 μm in total. The condition of the copper plating was as follows.

Condition of Copper Plating

Composition of plating solution: concentration of copper: 100 g/L, concentration of sulfuric acid: 100 g/L Temperature of plating solution: 50° C.

Current density: 0.2 A/dm$^2$

In the case where the thickness of one or both of the copper foils was larger than 18 μm, one or both of the copper foils after laminating on the resin to form the copper-clad laminate board was etched to make the thickness of the copper foil of 18 μm. In the case where the thickness of the copper foil was 18 μm, the thickness of the copper foil was not adjusted. The measuring methods of the thickness of the copper foil or the total thickness of the copper foil and the copper plating were the same with the said method. When the thickness of the one of the copper foils of the said copper-clad laminate board was measured, the other of the copper foils was masked with a masking tape having resistance properties against an etching liquid (an acid-proof tape, and the like), and then, the thickness of the one of the copper foils was measured. Thereafter, a micro-strip line designed to have an impedance of 50Ω was formed on the copper foil (which was the copper foil and the copper plated layer in the case where the copper plated layer was formed on the surface of the copper foil) on one side of the copper-clad laminate board. The length of the circuit was 5 cm. The copper-clad laminate board had a width of 1 cm (the width direction of the specimen was in parallel to TD) and a length of 13 cm (the length direction of the specimen was in parallel to the traveling direction (MD) of the copper foil in the copper foil production equipment). On the side of the copper-clad laminate board having the micro-strip line formed thereon, a resin shown in the column "Kind of resin" in Table 1 (a liquid crystal polymer, for example herein) having a thickness of 25 μm and the copper foil of each of Examples and Comparative Examples were laminated in this order by hot press under the temperature and time conditions shown in the column "Temperature and time on laminating copper foil and resin" in Table 1. The pressure on laminating the copper foil and the resin by pressing was 3.5 MPa when the resin was LCP, 4 MPa when the resin was Low dielectric PI, 5 MPa when the resin was PTFE, 1 MPa when the resin was PET, and 1.5 MPa when the resin was COP. Thereafter, in the case where the thickness of the copper foil newly laminated was not 18 μm, the thickness of the copper foil was adjusted to 18 μm in the aforementioned manner. The measuring methods of the thickness of the copper foil or the total thickness of the copper foil and the copper plating were the same with the said method. The copper foil (and the copper plating), where the thickness thereof was not measured, was covered with a masking tape.

Figure 3:
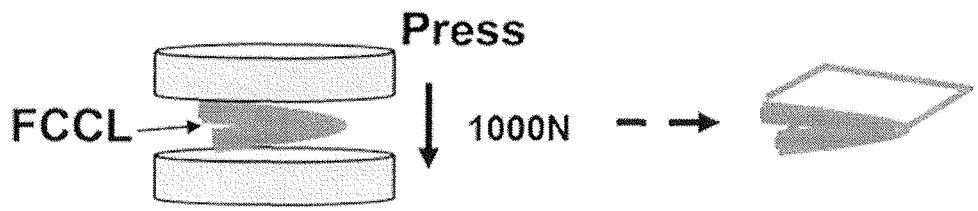
FIG. 3 is a schematic illustration showing the test for evaluating the transmission loss in the examples.

The resulting specimen was folded once (180° contact folding) with a load of 1,000 N in the direction of the folding axis in parallel to the width direction of the specimen and perpendicular to the length direction thereof, as shown in FIG. 3. Thereafter, the specimen was measured for the transmission loss of a signal having a frequency of 20 GHz.

The test conditions and the test results are shown in Tables 1 and 2.

TABLE 1

| | Thickness of copper foil (μm) | Kind of copper foil | Composition of copper foil (ppm by mass) | Rolling reduction in final cold rolling (%) | Surface treatment condition No. (shown in Table 2) | Surface roughness Ra of surface of copper foil laminated on resin | Surface roughness Rz of surface of copper foil laminated on resin | Area ratio of surface of copper foil laminated on resin |
|---|---|---|---|---|---|---|---|---|
| Example 1 | 18 | rolled copper foil | 200 ppm Ag-TPC | 95 | 1 | 0.10 | 0.95 | 2.15 |
| Example 2 | 12 | rolled copper foil | 200 ppm Ag-TPC | 95 | 5 + 6 | 0.30 | 2.00 | 2.80 |
| Example 3 | 18 | rolled copper foil | 200 ppm Ag-TPC | 97 | 1 | 0.10 | 0.95 | 2.15 |
| Example 4 | 9 | rolled copper foil | 200 ppm Ag-TPC | 99 | 7 | 0.05 | 0.25 | 1.50 |
| Example 5 | 12 | rolled copper foil | 200 ppm Ag-TPC | 99 | 7 | 0.05 | 0.25 | 1.50 |
| Example 6 | 18 | rolled copper foil | 200 ppm Ag-TPC | 99 | 7 | 0.05 | 0.25 | 1.50 |
| Example 7 | 12 | rolled copper foil | 200 ppm Ag-TPC | 99 | 7 | 0.05 | 0.25 | 1.50 |
| Example 8 | 18 | rolled copper foil | 200 ppm Ag-TPC | 98.5 | 4 | 0.20 | 1.00 | 2.20 |
| Example 9 | 12 | rolled copper foil | TPC | 95 | 2 + 7 | 0.14 | 0.90 | 2.00 |
| Example 10 | 70 | rolled copper foil | 100 ppm Ag-OFC | 98.5 | 3 | 0.16 | 1.30 | 2.50 |
| Example 11 | 18 | rolled copper foil | 30 ppm Sn—10 ppm P—10 ppm Mg-OFC | 95.5 | 1 | 0.09 | 0.95 | 2.14 |
| Example 12 | 12 | rolled copper foil | 60 ppm Ni—30 ppm Mn—60 ppm Si-OFC | 95.5 | 5 + 8 | 0.29 | 1.99 | 2.75 |
| Example 13 | 18 | rolled copper foil | 60 ppm Cr—60 ppm Zr—60 ppm Zn-OFC | 97 | 1 | 0.10 | 0.95 | 2.15 |
| Example 14 | 9 | rolled copper foil | 50 ppm Co—30 ppm Ag—30 ppm Mo-TPC | 99 | 7 | 0.05 | 0.25 | 1.50 |
| Comparative Example 1 | 12 | electrolytic copper foil | Cu: 99.0% by mass or more | — | 6 | 0.45 | 2.50 | 3.10 |
| Comparative Example 2 | 18 | electrolytic copper foil | Cu: 99.0% by mass or more | — | 8 | 0.01 | 0.25 | 1.43 |
| Comparative Example 3 | 9 | rolled copper foil | 200 ppm Ag-TPC | 94 | 7 | 0.05 | 0.20 | 1.40 |
| Comparative Example 4 | 12 | rolled copper foil | 200 ppm Ag-TPC | 95 | 1 | 0.10 | 0.95 | 2.15 |
| Comparative Example 5 | 18 | electrolytic copper foil | Cu: 99.0% by mass or more | — | 8 | 0.01 | 0.25 | 1.43 |
| Comparative Example 6 | 9 | rolled copper foil | TPC | 90 | 7 | 0.05 | 0.20 | 1.42 |
| Comparative Example 7 | 12 | rolled copper foil | 100 ppm Ag-OFC | 95 | 1 | 0.10 | 0.95 | 2.13 |
| Comparative Example 8 | 18 | electrolytic copper foil | Cu: 99.0% by mass or more | — | 8 | 0.01 | 0.25 | 1.43 |
| Comparative Example 9 | 9 | rolled copper foil | TPC | 90 | 7 | 0.05 | 0.20 | 1.42 |
| Comparative Example 10 | 12 | rolled copper foil | TPC | 96 | 1 | 0.10 | 0.95 | 2.20 |
| Comparative Example 11 | 12 | rolled copper foil | 1200 ppm Sn-OFC | 94 | 1 | 0.10 | 0.95 | 2.10 |
| Comparative Example 12 | 9 | rolled copper foil | TPC | 88 | 7 | 0.07 | 0.25 | 1.45 |
| Comparative Example 13 | 9 | rolled copper foil | TPC | 95 | 7 | 0.03 | 0.18 | 1.39 |

| | Temperature and time on laminating copper foil and resin | Kind of resin | Dielectric constant of resin | Average crystal grain size in parallel to rolling direction and thickness direction after lamination (μm) | Number of folding | Number of cracks (depth: 1 μm or more) | Number of cracks (depth: 2 μm or more) | Transmission loss after forming circuit and after folding [20 GHz] (dB/cm) |
|---|---|---|---|---|---|---|---|---|
| Example 1 | 350° C. × 30 min | PTFE | 2.1 | 150 | 3 | 0 | 0 | 2.9 |
| Example 2 | 350° C. × 30 min | PTFE | 2.1 | 150 | 4 | 0 | 0 | 4.3 |
| Example 3 | 350° C. × 30 min | PTFE | 2.1 | 170 | 4 | 0 | 0 | 3.2 |
| Example 4 | 370° C. × 0.8 sec | low dielectric PI | 3.2 | 60 | 2 | 2 | 1 | 4.2 |
| Example 5 | 370° C. × 2 sec | low dielectric PI | 3.2 | 90 | 3 | 0 | 0 | 3.8 |
| Example 6 | 350° C. × 4 sec | low dielectric PI | 3.2 | 110 | 4 | 0 | 0 | 3.7 |

TABLE 1-continued

| | | | | | | | |
|---|---|---|---|---|---|---|---|
| Example 7 | 300° C. × 10 min | low dielectric PI | 3.2 | 150 | 6 | 0 | 0 | 3.5 |
| Example 8 | 300° C. × 10 min | LCP | 2.9 | 120 | 6 | 0 | 0 | 3.5 |
| Example 9 | 300° C. × 10 min | LCP | 2.9 | 20 | 1 | 3 | 2 | 4.3 |
| Example 10 | 300° C. × 10 min | LCP | 2.9 | 80 | 4 | 1 | 0 | 3.9 |
| Example 11 | 350° C. × 30 min | PTFE | 2.1 | 155 | 3 | 0 | 0 | 2.9 |
| Example 12 | 350° C. × 30 min | PTFE | 2.1 | 152 | 4 | 0 | 0 | 4.3 |
| Example 13 | 350° C. × 30 min | PTFE | 2.1 | 170 | 4 | 0 | 0 | 3.2 |
| Example 14 | 370° C. × 0.8 sec | low dielectric PI | 3.2 | 55 | 2 | 2 | 1 | 4.2 |
| Comparative Example 1 | 350° C. × 30 min | PTFE | 2.1 | 5 | 0 | 15 | 12 | 4.9 |
| Comparative Example 2 | 130° C. × 30 min | COP | 2.4 | 7 | 0 | 15 | 12 | 4.6 |
| Comparative Example 3 | 140° C. × 10 min | COP | 2.4 | 1.5 | 0 | >20 | >20 | 4.9 |
| Comparative Example 4 | 110° C. × 5 min | PET | 3.2 | 0.60 | 0 | >20 | >20 | unmeasurable |
| Comparative Example 5 | 160° C. × 15 min | COP | 2.4 | 13 | 0 | 18 | 14 | 4.6 |
| Comparative Example 6 | 160° C. × 20 min | COP | 2.4 | 18 | 0 | 16 | 13 | 4.5 |
| Comparative Example 7 | 110° C. × 5 min | PET | 3.2 | 0.60 | 0 | >20 | >20 | unmeasurable |
| Comparative Example 8 | 180° C. × 5 min | COP | 2.4 | 9 | 0 | >20 | >20 | 4.6 |
| Comparative Example 9 | 200° C. × 1 min | PI | 3.5 | 4 | 0 | >20 | >20 | 5.0 |
| Comparative Example 10 | 110° C. × 5 min | PET | 3.2 | 0.60 | 0 | >20 | >20 | unmeasurable |
| Comparative Example 11 | 300° C. × 10 min | LCP | 2.9 | 0.60 | 0 | >20 | >20 | unmeasurable |
| Comparative Example 12 | 160° C. × 20 min | COP | 2.4 | 15 | 0 | 19 | 15 | 4.8 |
| Comparative Example 13 | 160° C. × 20 min | COP | 2.4 | 20 | 0 | 19 | 18 | 4.9 |

TABLE 2

| Surface treatment condition | Current condition for primary particles (primary particle plating solution (I) + (II)) | Current condition for secondary particles (secondary particle plating solution (A)) | Primary particle plating solution (I) | Primary particle plating solution (II) | Secondary particle plating solution (A) |
|---|---|---|---|---|---|
| 1 | (48 A/dm2, 60 As/dm2) + (5 A/dm2, 21 As/dm2) | (28 A/dm2, 19 As/dm2) | Cu: 10 g/l, H2SO4: 56 g/l, 35° C. | Cu: 23 g/l, H2SO4: 75 g/l, 40° C. | Cu: 12 g/l, Co: 9 g/l, Ni: 9 g/l, 35° C., pH 3.0 |
| 2 | (45 A/dm2, 70 As/dm2) + (7 A/dm2, 20 As/dm2) | (30 A/dm2, 18 As/dm2) | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| 3 | (48 A/dm2, 72 As/dm2) + (9 A/dm2, 23 As/dm2) | (33 A/dm2, 20 As/dm2) | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| 4 | (50 A/dm2, 75 As/dm2) + (8 A/dm2, 25 As/dm2) | (30 A/dm2, 20 As/dm2) | Cu: 10 g/l, H2SO4: 60 g/l, 35° C. | Cu: 23 g/l, H2SO4: 80 g/l, 40° C. | Cu: 15 g/l, Co: 10 g/l, Ni: 10 g/l, 35° C., pH 3.0 |
| 5 | (50 A/dm2, 100 As/dm2) + (8 A/dm2, 36 As/dm2) | (30 A/dm2, 30 As/dm2) | Cu: 12 g/l, H2SO4: 60 g/l, 35° C. | Cu: 27 g/l, H2SO4: 80 g/l, 40° C. | Cu: 15 g/l, Co: 10 g/l, Ni: 10 g/l, 35° C., pH 3.0 |
| 6 | (50 A/dm2, 110 As/dm2) + (8 A/dm2, 45 As/dm2) | (30 A/dm2, 30 As/dm2) | Cu: 12 g/l, H2SO4: 60 g/l, 35° C. | Cu: 27 g/l, H2SO4: 80 g/l, 40° C. | Cu: 15 g/l, Co: 10 g/l, Ni: 10 g/l, 35° C., pH 3.0 |

| Surface treatment condition | Cover plating solution (kind) | Composition | Temperature of solution (° C.) | pH | Current density (A/dm$^2$) | Energizing time (sec) |
|---|---|---|---|---|---|---|
| 7 | Ni—Co | Co 1-20 g/l Ni 1-20 g/l | 30-80 | 1.5-3.5 | 1-20 | 0.1-4 |
| 8 | Ni | Ni 1-30 g/l | 40-50 | 2-5 | 0.5-5 | 0.5-3 |

In Examples 1 to 14, the number of times of folding was 1 or more in the folding test under the prescribed condition for the copper-clad laminate board, and the number of cracks having a depth of 1 μm or more from the surface of the copper foil was 3 or less after the sliding bending test in the prescribed number of times under the prescribed condition for the copper-clad laminate board, in the observation of the region having a size of the thickness of the copper foil×100 μm on the cross section of the copper foil in parallel to the sliding direction in the sliding bending test. Thus, the transmission loss was favorably suppressed.

In Comparative Examples 1 to 13, the number of times of folding was 0 in the folding test under the prescribed condition for the copper-clad laminate board, and the number of cracks having a depth of 1 μm or more from the surface of the copper foil exceeded 3 after the sliding bending test in the prescribed number of times under the prescribed condition for the copper-clad laminate board, in the observation of the region having a size of the thickness of the copper foil×100 μm on the cross section of the copper foil in parallel to the sliding direction in the sliding bending test. Thus, the transmission loss was poor.

The invention claimed is:
1. A copper foil having a number of times of folding of 1 or more in a folding test under the following condition (G), when the copper foil is adhered in any one of the following conditions (D) to (F) to any one of the following insulating substrates (A) to (C), the insulating substrate having a thickness of 50 μm, to be a copper-clad laminate board,
(A) a fluorine resin,
(B) a polyimide resin having a dielectric dissipation factor of 0.01 or less, and
(C) a liquid crystal polymer resin,
(D) for a case where the insulating substrate is the fluorine resin, a pressure of 5 MPa, a heating temperature and a heating time of 350° C. for 30 minutes,
(E) for a case where the insulating substrate is the polyimide resin having a dielectric dissipation factor of 0.01 or less, a pressure of 4 MPa, a heating temperature and a heating time of any one of the following (E-1) to (E-4):
(E-1) 370° C. for 0.8 second,
(E-2) 370° C. for 2 seconds,
(E-3) 350° C. for 4 seconds, and
(E-4) 300° C. for 10 minutes, and
(F) for a case where the insulating substrate is the liquid crystal polymer resin, a pressure of 3.5 MPa, a heating temperature and a heating time of 300° C. for 10 minutes,
(G) folding test condition:
in a case where a thickness of the copper foil is smaller than 12 μm, the copper foil after adhering on the insulating substrate to form the copper-clad laminate board is subjected to copper plating to make a total thickness of the copper foil and the copper plating of 12 μm, and the condition of the copper plating is as follows,
condition of the copper plating:
composition of plating solution: concentration of copper: 100 g/L, concentration of sulfuric acid: 100 g/L
temperature of plating solution: 50° C.
current density: 0.8 A/dm$^2$, and
in a case where a thickness of the copper foil is larger than 12 μm, the copper foil after adhering on the insulating substrate to form the copper-clad laminate board is etched to make the thickness of the copper foil of 12 μm,
in a case where a thickness of the copper foil is 12 μm, the thickness of the copper foil is not adjusted,
the thickness of the copper foil is calculated by the following expression:

thickness of copper foil (μm)=(weight of specimen of copper foil (g))/((area of specimen of copper foil (cm$^2$))×(density of copper, 8.94 (g/cm$^3$)))×10$^4$ (μm/cm), the thickness of the copper foil after adhering the copper foil and the insulating substrate is calculated by the following expression, and in the case where a total thickness of the copper foil and the copper plating is calculated by the following expression, with replacing "thickness of copper foil (μm)" with "total thickness of the copper foil and the copper plating (μm)", and "copper foil" with "copper foil and copper plating" in the following expression, thickness of copper foil (μm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm$^2$))×(density of copper, 8.94 (g/cm$^3$)))×10$^4$ (μm/cm), a number of test pieces having a width of 12.7 mm and a length of 100 mm are cut out from the copper-clad laminate board in such a manner that a width direction of the test piece is in parallel to a transverse direction, and a length direction of the test piece is in parallel to a machine direction, and then, the test piece is folded (180° contact folding) with the copper foil directed outward by pressing with a load of 1,000 N in the direction of a folding axis in parallel to the width direction of the test piece and perpendicular to the length direction of the test piece, and then the presence of a crack in the copper foil is confirmed,
in a case where a crack is observed, a cross section of the copper foil perpendicular to the folding axis of the test piece and in parallel to the thickness direction of the copper foil is observed to measure the length of the crack,
in a case where the length of the crack is 3 μm or more, it is determined that a crack is observed,
in a case where the length of the crack is less than 3 μm, it is determined that no crack is observed,
the number of times of the observation of a crack in the copper foil is designated as the number of times of folding of the copper foil,
in a case where no crack is observed, the test piece is again flattened by pressing with a load of 1,000 N, and then, the test piece is again folded in the same manner as above,
when the observation of the cross section is performed to determine that no crack is observed because the length of the crack is less than 3 μm, the same evaluation is performed, by using a different test piece, with one more time of folding than the number of times of folding wherein it is determined that no crack is observed, and
the evaluation is performed three times, and the average value of the number of times of folding in the three times evaluations is designated as the number of times of folding.
2. The copper foil according to claim 1, wherein the copper foil satisfies at least one of the following conditions (2-1) to (2-2):
(2-1) the copper foil has a number of cracks having a depth of 1 μm or more from a surface of the copper foil being 3 or less after a sliding bending test under the following condition (H) for a copper-clad laminate board containing the copper foil having any one of the following insulating substrates (A) to (C), the insulating substrates having a thickness of 50 μm, adhered to the copper foil in any one of the following conditions (D) to (F), in an observation of a region having a size of a thickness of the copper foil×100 μm on a cross section of the copper foil in parallel to a sliding direction in the sliding bending test;
(2-2) the copper foil has a number of cracks having a depth of 2 μm or more from a surface of the copper foil being 2 or less after a sliding bending test under the following condition (H) for a copper-clad laminate board containing the copper foil having any one of the following insulating substrates (A) to (C), the insulating substrates having a thickness of 50 μm, adhered to the copper foil in any one of the following conditions (D) to (F), in an observation of a region having a size of a thickness of the copper foil×100 μm on a cross section of the copper foil in parallel to a sliding direction in the sliding bending test,
(A) a fluorine resin,
(B) a polyimide resin having a dielectric dissipation factor of 0.01 or less, and
(C) a liquid crystal polymer resin,
(D) for a case where the insulating substrate is the fluorine resin, a pressure of 5 MPa, a heating temperature and a heating time of 350° C. for 30 minutes,
(E) for a case where the insulating substrate is the polyimide resin having a dielectric dissipation factor of 0.01 or less, a pressure of 4 MPa, a heating temperature and a heating time of any one of the following (E-1) to (E-4):
(E-1) 370° C. for 0.8 second,
(E-2) 370° C. for 2 seconds,
(E-3) 350° C. for 4 seconds, and
(E-4) 300° C. for 10 minutes, and
(F) for a case where the insulating substrate is the liquid crystal polymer resin, a pressure of 3.5 MPa, a heating temperature and a heating time of 300° C. for 10 minutes,
(H) sliding bending test condition:
  in a case where a thickness of the copper foil is smaller than 12 μm, the copper foil after adhering on the insulating substrate to form the copper-clad laminate board is subjected to copper plating to make a total thickness of the copper foil and the copper plating of 12 μm, and the condition of the copper plating is as follows,
  condition of the copper plating:
    composition of plating solution: concentration of copper: 100 g/L, concentration of sulfuric acid: 100 g/L
    temperature of plating solution: 50° C.
    current density: 0.8 A/dm$^2$, and
  in a case where a thickness of the copper foil is larger than 12 μm, the copper foil after adhering on the insulating substrate to form the copper-clad laminate board is etched to make the thickness of the copper foil of 12 μm,
  in a case where a thickness of the copper foil is 12 μm, the thickness of the copper foil is not adjusted,
  the thickness of the copper foil is calculated by the following expression:

thickness of copper foil (μm)=(weight of specimen of copper foil (g))/((area of specimen of copper foil (cm$^2$))×(density of copper, 8.94 (g/cm$^3$)))× 10$^4$ (μm/cm), the thickness of the copper foil after adhering the copper foil and the insulating substrate is calculated by the following expression, and in the case where a total thickness of the copper foil and the copper plating is calculated by the following expression, with replacing "thickness of copper foil (μm)" to "total thickness of the copper foil and the copper plating (μm)", and "copper foil" to "copper foil and copper plating" in the following expression, thickness of copper foil (μm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm$^2$))× (density of copper, 8.94 (g/cm$^3$)))×10$^4$ (μm/cm), a test piece having a width of 12.7 mm and a length of 200 mm is cut out from the copper-clad laminate board in such a manner that a width direction of the test piece is in parallel to a transverse direction of the copper foil, and a length direction of the test piece is in parallel to a machine direction, and then, a circuit having a circuit width of 300 μm and a space width between circuits of 300 μm (line and space L/S=300 μm/300 μm) are formed on the copper foil of the test piece by etching, so as to produce a flexible printed wiring board (FPC), and then, the flexible printed wiring board is subjected to a sliding bending test under the following condition (I), and the number of cracks having a depth of 1 μm or more from a surface of the copper foil is measured by observing the region having a size of the thickness of the copper foil×100 μm on a cross section of the copper foil in parallel to a sliding direction in the sliding bending test,
  the sliding direction is in parallel to the length direction of the test piece (i.e., the machine direction of the copper foil), the measurement is performed for three view fields each having a size of the thickness of the copper foil×100 μm, and the average number of cracks of the three view fields is designated as the number of cracks having a depth of 1 μm or more from the surface of the copper foil, the length of the line that is drawn following the crack from the surface of the copper foil on a cross sectional micrograph is designated as a crack length,
  (I) condition:
    Bending radius: 1.5 mm
    Stroke: 25 mm
    Bending speed: 1,500 per min
    Number of times of sliding and bending: 10,000
    L/S: 300 μm/300 μm
  the sliding bending test is performed by using an IPC (Institute for Printed Circuits, USA) bending test equipment, the equipment has a structure containing an oscillation driver having a vibration transmitting member connected thereto, and the FPC is fixed to the equipment at four positions, two screws and apical ends of the vibration transmitting member,
  with a vibration of the vibration transmitting member in the vertical direction, an intermediate portion of the FPC is bent in the form of a hairpin with a prescribed curvature radius r, and
  the sliding and bending test is performed in such a manner that a surface of the FPC having the circuit thereon is directed inward of the bent portion with the curvature radius r.

3. The copper foil according to claim 1, wherein the insulating substrate is a polytetrafluoroethylene resin, a polyimide resin having a dielectric dissipation factor of 0.006 or less, or a liquid crystal polymer resin containing a copolymer of a hydroxybenzoate ester and a hydroxynaphthoate ester.

4. The copper foil according to claim 1, wherein the copper foil comprises a surface-treated surface on one surface or both surfaces of the copper foil, and the surface-treated surface has an arithmetic average surface roughness Ra of from 0.05 to 0.40 μm, a ten-point average surface roughness Rz of from 0.25 to 2.0 μm, and a surface area ratio A/B of from 1.5 to 3.0, wherein A represents a three-dimensional surface area measured with a laser microscope, and B represents a two-dimensional surface area in a planar view of a view field for measuring the three-dimensional surface area A.

5. The copper foil according to claim 1, wherein the copper foil has an average crystal grain size of 20 μm or more on a cross section in parallel to a thickness direction of the copper foil and in parallel to the machine direction of the copper foil, after forming a copper-clad laminate board containing the copper foil having an insulating substrate adhered to the copper foil.

6. The copper foil according to claim 1, wherein the copper foil is a rolled copper foil.

7. The copper foil according to claim 1, wherein the copper foil is for attaching to a resin having a dielectric constant of 3.5 or less.

8. The copper foil according to claim 1, wherein the copper foil is for attaching to a liquid crystal polymer or a fluorine resin or a low induction polyimide resin.

9. The copper foil according to claim 1, wherein the copper foil is used in a copper-clad laminate board or a printed wiring board that is used under a high frequency exceeding 1 GHz.

10. The copper foil according to claim 1, satisfying at least one of the following conditions (14-1) to (14-10):
    (14-1) the copper foil contains, on a surface of the copper foil, one or more layers selected from the group consisting of a roughening treatment layer, a heat resistance treatment layer, a rust prevention treatment layer, a chromate treatment layer, and a silane coupling treatment layer;
    (14-2) the copper foil contains, on a surface of the copper foil, one or more layers selected from the group consisting of a heat resistance treatment layer, a rust prevention treatment layer, a chromate treatment layer, and a silane coupling treatment layer;
    (14-3) the copper foil contains a heat resistance treatment layer or a rust prevention treatment layer on a surface of the copper foil, contains a chromate treatment layer on the heat resistance treatment layer or the rust prevention treatment layer, and contains a silane coupling treatment layer on the chromate treatment layer;
    (14-4) the copper foil contains a heat resistance treatment layer on a surface of the copper foil, contains a rust prevention treatment layer on the heat resistance treatment layer, contains a chromate treatment layer on the rust prevention treatment layer, and contains a silane coupling treatment layer on the chromate treatment layer;
    (14-5) the copper foil contains a chromate treatment layer on a surface of the copper foil, and contains a silane coupling treatment layer on the chromate treatment layer;
    (14-6) the copper foil contains a roughening treatment layer on a surface of the copper foil, contains a chromate treatment layer on the roughening treatment layer, and contains a silane coupling treatment layer on the chromate treatment layer;
    (14-7) the copper foil contains a roughening treatment layer on a surface of the copper foil, contains one or more layers selected from the group consisting of a rust prevention treatment layer and a heat resistance treatment layer on the roughening treatment layer, contains a chromate treatment layer on the one or more layers selected from the group consisting of a rust prevention treatment layer and a heat resistance treatment layer, and contains a silane coupling treatment layer on the chromate treatment layer;
    (14-8) the copper foil contains a roughening treatment layer on a surface of the copper foil, contains a rust prevention treatment layer on the roughening treatment layer, contains a chromate treatment layer on the rust prevention treatment layer, and contains a silane coupling treatment layer on the chromate treatment layer;
    (14-9) the copper foil contains a roughening treatment layer on a surface of the copper foil, and contains a silane coupling treatment layer on the roughening treatment layer;
    (14-10) the copper foil contains a silane coupling treatment layer on a surface of the copper foil.

11. A copper-clad laminate board comprising the copper foil according to claim 1 and an insulating substrate that are adhered to each other.

12. The copper-clad laminate board according to claim 11, wherein the copper-clad laminate board is used under a high frequency exceeding 1 GHz.

13. A copper foil satisfying at least one of the following conditions (3-1) to (3-2):
    (3-1) the copper foil has a number of cracks having a depth of 1 μm or more from a surface of the copper foil being 3 or less after a sliding bending test under the following condition (H) for a copper-clad laminate board containing the copper foil having any one of the following insulating substrates (A) to (C), the insulating substrate having a thickness of 50 μm, adhered to the copper foil in any one of the following conditions (D) to (F), in an observation of a region having a size of a thickness of the copper foil×100 μm on a cross section of the copper foil in parallel to a sliding direction in the sliding bending test;
    (3-2) the copper foil has a number of cracks having a depth of 2 μm or more from a surface of the copper foil being 2 or less after a sliding bending test under the following condition (H) for a copper-clad laminate board containing the copper foil having any one of the following insulating substrates (A) to (C), the insulating substrate having a thickness of 50 μm, adhered to the copper foil in any one of the following conditions (D) to (F), in an observation of a region having a size of a thickness of the copper foil×100 μm on a cross section of the copper foil in parallel to a sliding direction in the sliding bending test,
    (A) a fluorine resin,
    (B) a polyimide resin having a dielectric dissipation factor of 0.01 or less, and
    (C) a liquid crystal polymer resin,
    (D) for a case where the insulating substrate is the fluorine resin, a pressure of 5 MPa, a heating temperature and a heating time of 350° C. for 30 minutes,
    (E) for a case where the insulating substrate is the polyimide resin having a dielectric dissipation factor of 0.01 or less, a pressure of 4 MPa, a heating temperature and a heating time of any one of the following (E-1) to (E-4):
    (E-1) 370° C. for 0.8 second,
    (E-2) 370° C. for 2 seconds,
    (E-3) 350° C. for 4 seconds, and
    (E-4) 300° C. for 10 minutes, and
    (F) for a case where the insulating substrate is the liquid crystal polymer resin, a pressure of 3.5 MPa, a heating temperature and a heating time of 300° C. for 10 minutes,
    (H) sliding bending test condition:
        in a case where a thickness of the copper foil is smaller than 12 μm, the copper foil after adhering on the insulating substrate to form the copper-clad laminate board is subjected to copper plating to make a total thickness of the copper foil and the copper plating of 12 µm, and the condition of the copper plating is as follows, condition of the copper plating:
composition of plating solution: concentration of copper: 100 g/L, concentration of sulfuric acid: 100 g/L
temperature of plating solution: 50° C.
current density: 0.8 A/dm$^2$, and in a case where a thickness of the copper foil is larger than 12 µm, the copper foil after adhering on the insulating substrate to form the copper-clad laminate board is etched to make the thickness of the copper foil of 12 µm, in a case where a thickness of the copper foil is 12 µm, the thickness of the copper foil is not adjusted, the thickness of the copper foil is calculated by the following expression:

thickness of copper foil (µm)=(weight of specimen of copper foil (g))/((area of specimen of copper foil (cm$^2$))×(density of copper, 8.94 (g/cm$^3$)))×10$^4$ (µm/cm), the thickness of the copper foil after adhering the copper foil and the insulating substrate is calculated by the following expression, and in the case where a total thickness of the copper foil and the copper plating is calculated by the following expression, with replacing "thickness of copper foil (µm)" to "total thickness of the copper foil and the copper plating (µm)", and "copper foil" to "copper foil and copper plating" in the following expression, thickness of copper foil (µm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm$^2$))×(density of copper, 8.94 (g/cm$^3$)))×10$^4$ (µm/cm), a test piece having a width of 12.7 mm and a length of 200 mm is cut out from the copper-clad laminate board in such a manner that a width direction of the test piece is in parallel to a transverse direction of the copper foil, and a length direction of the test piece is in parallel to a machine direction, and then, a circuit having a circuit width of 300 µm and a space width between circuits of 300 µm (line and space L/S=300 µm/300 µm) are formed on the copper foil of the test piece by etching, so as to produce a flexible printed wiring board (FPC), and then, the flexible printed wiring board is subjected to a sliding bending test under the following condition (I), and the number of cracks having a depth of 1 µm or more from the surface of the copper foil is measured by observing the region having a size of the thickness of the copper foil×100 µm on the cross section of the copper foil in parallel to a sliding direction in the sliding bending test, the sliding direction is in parallel to the length direction of the test piece (i.e., the machine direction of the copper foil), the measurement is performed for three view fields each having a size of the thickness of the copper foil×100 µm, and the average number of cracks of the three view fields is designated as the number of cracks having a depth of 1 µm or more from the surface of the copper foil, the length of the line that is drawn following the crack from the surface of the copper foil on a cross sectional micrograph is designated as the crack length, (I) condition:
Bending radius: 1.5 mm
Stroke: 25 mm
Bending speed: 1,500 per min
Number of times of sliding and bending: 10,000
L/S: 300 µm/300 µm the sliding bending test is performed by using an IPC (Institute for Printed Circuits, USA) bending test equipment, the equipment has a structure containing an oscillation driver having a vibration transmitting member connected thereto, and the FPC is fixed to the equipment at four positions, two screws and the apical ends of the vibration transmitting member, with a vibration of the vibration transmitting member in the vertical direction, the intermediate portion of the FPC is bent in a form of a hairpin with a prescribed curvature radius r, and the sliding and bending test is performed in such a manner that a surface of the FPC having the circuit thereon is directed inward of the bent portion with the curvature radius r.

14. A copper foil, wherein the copper foil comprises a surface-treated surface on one surface or both surfaces of the copper foil, and the surface-treated surface has an arithmetic average surface roughness Ra of from 0.05 to 0.40 µm, a ten-point average surface roughness Rz of from 0.25 to 2.0 µm, and a surface area ratio A/B of from 1.5 to 3.0, wherein A represents a three-dimensional surface area measured with a laser microscope, and B represents a two-dimensional surface area in a planar view of a view field for measuring the three-dimensional surface area A, and satisfies at least one of the following conditions (8-1) to (8-2):

(8-1) an arithmetic average surface roughness Ra is 0.10 µm or more,
(8-2) a surface area ratio A/B is 2.14 or less.

15. The copper foil according to claim 14, wherein the copper foil has an average crystal grain size of 20 µm or more on a cross section in parallel to a thickness direction of the copper foil and in parallel to the machine direction of the copper foil, after forming a copper-clad laminate board containing the copper foil having an insulating substrate adhered to the copper foil.

16. A copper-clad laminate board comprising a copper foil and any one of the following insulating substrates (A) to (C), the insulating substrate having a thickness of 50 µm, that are adhered to each other in any one of the following conditions (D) to (F), the copper-clad laminate board having a number of times of folding of 1 or more in a folding test under the following condition (G), (A) a fluorine resin,
(B) a polyimide resin having a dielectric dissipation factor of 0.01 or less, and
(C) a liquid crystal polymer resin,
(D) for a case where the insulating substrate is the fluorine resin, a pressure of 5 MPa, a heating temperature and a heating time of 350° C. for 30 minutes,
(E) for a case where the insulating substrate is the polyimide resin having a dielectric dissipation factor of 0.01 or less, a pressure of 4 MPa, a heating temperature and a heating time of any one of the following (E-1) to (E-4):
(E-1) 370° C. for 0.8 second,
(E-2) 370° C. for 2 seconds,
(E-3) 350° C. for 4 seconds, and
(E-4) 300° C. for 10 minutes, and (F) for a case where the insulating substrate is the liquid crystal polymer resin, a pressure of 3.5 MPa, a heating temperature and a heating time of 300° C. for 10 minutes,
(G) folding test condition:
   in a case where a thickness of the copper foil is smaller than 12 μm, the copper foil after adhering on the insulating substrate to form the copper-clad laminate board is subjected to copper plating to make a total thickness of the copper foil and the copper plating of 12 μm, and a condition of the copper plating is as follows,
   condition of the copper plating:
      composition of plating solution: concentration of copper: 100 g/L, concentration of sulfuric acid: 100 g/L
      temperature of plating solution: 50° C.
      current density: 0.8 A/dm², and
   in a case where a thickness of the copper foil is larger than 12 μm, the copper foil after adhering on the insulating substrate to form the copper-clad laminate board is etched to make the thickness of the copper foil of 12 μm,
   in a case where a thickness of the copper foil is 12 μm, the thickness of the copper foil is not adjusted,
   the thickness of the copper foil is calculated by the following expression:

thickness of copper foil (μm)=(weight of specimen of copper foil (g))/((area of specimen of copper foil (cm²))×(density of copper, 8.94 (g/cm³)))× 10⁴ (μm/cm), the thickness of the copper foil after adhering the copper foil and the insulating substrate is calculated by the following expression, and in a case where a total thickness of the copper foil and the copper plating is calculated by the following expression, with replacing "thickness of copper foil (μm)" with "total thickness of the copper foil and the copper plating (μm)", and "copper foil" with "copper foil and copper plating" in the following expression, thickness of copper foil (μm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm²))× (density of copper, 8.94 (g/cm³)))×10⁴ (μm/cm), a number of test pieces having a width of 12.7 mm and a length of 100 mm are cut out from the copper-clad laminate board in such a manner that a width direction of the test piece is in parallel to a transverse direction, and a length direction of the test piece is in parallel to a machine direction, and then, the test piece is folded (180° contact folding) with the copper foil directed outward by pressing with a load of 1,000 N in a direction of a folding axis in parallel to the width direction of the test piece and perpendicular to the length direction of the test piece, and then the presence of a crack in the copper foil is confirmed,
   in a case where a crack is observed, a cross section of the copper foil perpendicular to the folding axis of the test piece and in parallel to a thickness direction of the copper foil is observed to measure the length of the crack,
   in a case where the length of the crack is 3 μm or more, it is determined that a crack is observed,
   in a case where the length of the crack is less than 3 μm, it is determined that no crack is observed,
   the number of times of the observation of a crack in the copper foil is designated as the number of times of folding of the copper foil,
   in a case where no crack is observed, the test piece is again flattened by pressing with a load of 1,000 N, and then, the test piece is again folded in the same manner as above,
   when the observation of the cross section is performed to determine that no crack is observed because the length of the crack is less than 3 μm, the same evaluation is performed, by using a different test piece, with one more time of folding than the number of times of folding wherein it is determined that no crack is observed, and
   the evaluation is performed three times, and the average value of the number of times of folding in the three times evaluations is designated as the number of times of folding.

17. The copper-clad laminate board according to claim 16, satisfying at least one of the following conditions (18-1) to (18-2):
   (18-1) the copper foil has a number of cracks having a depth of 1 μm or more from a surface of the copper foil being 3 or less after a sliding bending test under the following condition (H) for the copper-clad laminate board, in an observation of a region having a size of a thickness of the copper foil×100 μm on a cross section of the copper foil in parallel to a sliding direction in the sliding bending test;
   (18-2) the copper foil has a number of cracks having a depth of 2 μm or more from a surface of the copper foil being 2 or less after a sliding bending test under the following condition (H) for the copper-clad laminate board, in an observation of a region having a size of a thickness of the copper foil×100 μm on a cross section of the copper foil in parallel to a sliding direction in the sliding bending test,
(H) sliding bending test condition:
   in a case where a thickness of the copper foil is smaller than 12 μm, the copper foil after adhering on the insulating substrate to form the copper-clad laminate board is subjected to copper plating to make a total thickness of the copper foil and the copper plating of 12 μm, and the condition of the copper plating is as follows,
   condition of the copper plating:
      composition of plating solution: concentration of copper: 100 g/L, concentration of sulfuric acid: 100 g/L
      temperature of plating solution: 50° C.
      current density: 0.8 A/dm², and
   in a case where a thickness of the copper foil is larger than 12 μm, the copper foil after adhering on the insulating substrate to form the copper-clad laminate board is etched to make the thickness of the copper foil of 12 μm,
   in a case where a thickness of the copper foil is 12 μm, the thickness of the copper foil is not adjusted,
   the thickness of the copper foil is calculated by the following expression:

thickness of copper foil (μm)=(weight of specimen of copper foil (g))/((area of specimen of copper foil (cm²))×(density of copper, 8.94 (g/cm³)))× 10⁴ (μm/cm), the thickness of the copper foil after adhering the copper foil and the insulating substrate is calculated by the following expression, and in the case where a total thickness of the copper foil and the copper plating is calculated by the following expression, with replacing "thickness of copper foil (μm)" with "total thickness of the copper foil and the copper plating(μm)", and "copper foil" with "copper foil and copper plating" in the following expression, thickness of copper foil (μm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm$^2$))× (density of copper, 8.94 (g/cm$^3$)))×10$^4$ (μm/cm), a test piece having a width of 12.7 mm and a length of 200 mm is cut out from the copper-clad laminate board in such a manner that a width direction of the test piece is in parallel to a transverse direction of the copper foil, and a length direction of the test piece is in parallel to a machine direction, and then, a circuit having a circuit width of 300 μm and a space width between circuits of 300 μm (line and space L/S=300 μm/300 μm) are formed on the copper foil of the test piece by etching, so as to produce a flexible printed wiring board (FPC), and then, the flexible printed wiring board is subjected to a sliding bending test under the following condition (I), and the number of cracks having a depth of 1 μm or more from the surface of the copper foil is measured by observing the region having a size of the thickness of the copper foil×100 μm on the cross section of the copper foil in parallel to a sliding direction in the sliding bending test, the sliding direction is in parallel to the length direction of the test piece (i.e., the machine direction of the copper foil), the measurement is performed for three view fields each having a size of the thickness of the copper foil×100 μm, and an average number of cracks of the three view fields is designated as the number of cracks having a depth of 1 μm or more from the surface of the copper foil, the length of the line that is drawn following the crack from a surface of the copper foil on a cross sectional micrograph is designated as the crack length, (I) condition:
Bending radius: 1.5 mm
Stroke: 25 mm
Bending speed: 1,500 per min
Number of times of sliding and bending: 10,000
L/S: 300 μm/300 μm the sliding bending test is performed by using an IPC (Institute for Printed Circuits, USA) bending test equipment, the equipment has a structure containing an oscillation driver having a vibration transmitting member connected thereto, and the FPC is fixed to the equipment at four positions, the two screws and the apical ends of the vibration transmitting member, with a vibration of the vibration transmitting member in the vertical direction, an intermediate portion of the FPC 1 is bent in a form of a hairpin with a prescribed curvature radius r, and the sliding and bending test is performed in such a manner that a surface of the FPC having the circuit thereon is directed inward of the bent portion with the curvature radius r.

18. The copper-clad laminate board according to claim 16, wherein the insulating substrate constituting the copper-clad laminate board is any one of the following insulating substrates (H) to (J):
(H) a fluorine resin,
(I) a polyimide resin having a dielectric dissipation factor of 0.01 or less, and
(J) a liquid crystal polymer resin.

19. A method for producing a printed wiring board, comprising a step of conducting etching process of the copper-clad laminate board according to claim 16.

20. A method for producing an electronic apparatus, comprising a step of mounting electronic components on a printed wiring board produced by the production method according to claim 19.

21. A method for producing a transmission channel, comprising a step of conducting etching process of the copper-clad laminate board according to claim 16, the transmission channel being used under a high frequency exceeding 1 GHz.

22. A method for producing an antenna, comprising a step of conducting etching process of the copper-clad laminate board according to claim 16, the antenna being used under a high frequency exceeding 1 GHz.

23. A copper-clad laminate board comprising a copper foil and any one of the following insulating substrates (A) to (C), the insulating substrate having a thickness of 50 μm, that are adhered to each other in any one of the following conditions (D) to (F), satisfying at least one of the following conditions (19-1) to (19-2):
(19-1) the copper foil has a number of cracks having a depth of 1 μm or more from a surface of the copper foil being 3 or less after a sliding bending test under the following condition (H) for the copper-clad laminate board, in an observation of a region having a size of a thickness of the copper foil×100 μm on a cross section of the copper foil in parallel to a sliding direction in the sliding bending test;
(19-2) the copper foil has a number of cracks having a depth of 2 μm or more from a surface of the copper foil being 2 or less after a sliding bending test under the following condition (H) for the copper-clad laminate board, in an observation of a region having a size of a thickness of the copper foil×100 μm on a cross section of the copper foil in parallel to a sliding direction in the sliding bending test,
(A) a fluorine resin,
(B) a polyimide resin having a dielectric dissipation factor of 0.01 or less, and
(C) a liquid crystal polymer resin,
(D) for a case where the insulating substrate is the fluorine resin, a pressure of 5 MPa, a heating temperature and a heating time of 350° C. for 30 minutes,
(E) for a case where the insulating substrate is the polyimide resin having a dielectric dissipation factor of 0.01 or less, a pressure of 4 MPa, a heating temperature and a heating time of any one of the following (E-1) to (E-4):
(E-1) 370° C. for 0.8 second,
(E-2) 370° C. for 2 seconds,
(E-3) 350° C. for 4 seconds, and
(E-4) 300° C. for 10 minutes, and
(F) for a case where the insulating substrate is the liquid crystal polymer resin, a pressure of 3.5 MPa, a heating temperature and a heating time of 300° C. for 10 minutes, (H) sliding bending test condition:
in a case where a thickness of the copper foil is smaller than 12 μm, the copper foil after adhering on the insulating substrate to form the copper-clad laminate board is subjected to copper plating to make a total thickness of the copper foil and the copper plating of 12 μm, and a condition of the copper plating is as follows,
condition of the copper plating:
composition of plating solution: concentration of copper: 100 g/L, concentration of sulfuric acid: 100 g/L
temperature of plating solution: 50° C.
current density: 0.8 A/dm$^2$, and
in a case where a thickness of the copper foil is larger than 12 μm, the copper foil after adhering on the insulating substrate to form the copper-clad laminate board is etched to make the thickness of the copper foil of 12 μm,
in a case where a thickness of the copper foil is 12 μm, the thickness of the copper foil is not adjusted,
the thickness of the copper foil is calculated by the following expression:

thickness of copper foil (μm)=(weight of specimen of copper foil (g))/((area of specimen of copper foil (cm$^2$))×(density of copper, 8.94 (g/cm$^3$)))×10$^4$ (μm/cm), the thickness of the copper foil after adhering the copper foil and the insulating substrate is calculated by the following expression, and in the case where a total thickness of the copper foil and the copper plating is calculated by the following expression, with replacing "thickness of copper foil (μm)" with "total thickness of the copper foil and the copper plating (μm)", and "copper foil" with "copper foil and copper plating" in the following expression, thickness of copper foil (μm)=((weight of specimen of the laminate of the copper foil and the insulating substrate before etching (g))−(weight of the insulating substrate after removing the copper foil entirely from the specimen by etching (g)))/((area of specimen of the laminate of the copper foil and the insulating substrate (cm$^2$))×(density of copper, 8.94 (g/cm$^3$)))×10$^4$ (μm/cm), a test piece having a width of 12.7 mm and a length of 200 mm is cut out from the copper-clad laminate board in such a manner that a width direction of the test piece is in parallel to a transverse direction of the copper foil, and a length direction of the test piece is in parallel to a machine direction, and then, a circuit having a circuit width of 300 μm and a space width between circuits of 300 μm (line and space L/S=300 μm/ 300 μm) are formed on the copper foil of the test piece by etching, so as to produce a flexible printed wiring board (FPC), and then, the flexible printed wiring board is subjected to a sliding bending test under the following condition (I), and the number of cracks having a depth of 1 μm or more from the surface of the copper foil is measured by observing the region having a size of the thickness of the copper foil×100 μm on a cross section of the copper foil in parallel to a sliding direction in the sliding bending test,
the sliding direction is in parallel to the length direction of the test piece (i.e., the machine direction of the copper foil), the measurement is performed for three view fields each having a size of the thickness of the copper foil×100 μm, and the average number of cracks of the three view fields is designated as the number of cracks having a depth of 1 μm or more from a surface of the copper foil, the length of the line that is drawn following the crack from the surface of the copper foil on a cross sectional micrograph is designated as the crack length,
(I) condition:
Bending radius: 1.5 mm
Stroke: 25 mm
Bending speed: 1,500 per min
Number of times of sliding and bending: 10,000
L/S: 300 μm/300 μm
the sliding bending test is performed by using an IPC (Institute for Printed Circuits, USA) bending test equipment, the equipment has a structure containing an oscillation driver having a vibration transmitting member connected thereto, and the FPC is fixed to the equipment at four positions, two screws and the apical ends of the vibration transmitting member,
with a vibration of the vibration transmitting member in the vertical direction, the intermediate portion of the FPC is bent in the form of a hairpin with a prescribed curvature radius r, and
the sliding and bending test is performed in such a manner that a surface of the FPC having the circuit thereon is directed inward of the bent portion with the curvature radius r.

* * * * *